US 9,837,239 B2

(12) United States Patent
Hirsch

(10) Patent No.: US 9,837,239 B2
(45) Date of Patent: *Dec. 5, 2017

(54) TECHNIQUES FOR OPTIMIZING NANOTIPS DERIVED FROM FROZEN TAYLOR CONES

(71) Applicant: Gregory Hirsch, Pacifica, CA (US)

(72) Inventor: Gregory Hirsch, Pacifica, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/361,911

(22) Filed: Nov. 28, 2016

(65) Prior Publication Data

US 2017/0076901 A1    Mar. 16, 2017

Related U.S. Application Data

(63) Continuation-in-part of application No. 14/536,555, filed on Nov. 7, 2014, now Pat. No. 9,524,848.
(Continued)

(51) Int. Cl.
*G21K 5/02* (2006.01)
*H01J 9/02* (2006.01)
(Continued)

(52) U.S. Cl.
CPC .......... *H01J 9/025* (2013.01); *C23C 14/16* (2013.01); *C23C 14/24* (2013.01);
(Continued)

(58) Field of Classification Search
CPC combination set(s) only.
See application file for complete search history.

(56) References Cited

U.S. PATENT DOCUMENTS 4,264,641 A    4/1981    Mahoney et al.
4,762,975 A    8/1988    Mahoney et al.
(Continued)

FOREIGN PATENT DOCUMENTS

JP    2006-068711 A    3/2006

OTHER PUBLICATIONS

Antoine, et al., Electromigration Occurences and its Effects on Metallic Surfaces Submitted to High Electromagnetic Field: A Novel Approach to Breakdown Accelerators, CEA, SACM Centre d'Etudes de Saclay, 2011, p. 1-29, France.
(Continued)

*Primary Examiner* — David E Smith
*Assistant Examiner* — Hsien Tsai
(74) *Attorney, Agent, or Firm* — Asif Ghias

(57) ABSTRACT

Optimization techniques are disclosed for producing sharp and stable tips/nanotips relying on liquid Taylor cones created from electrically conductive materials with high melting points. A wire substrate of such a material with a preform end in the shape of a regular or concave cone, is first melted with a focused laser beam. Under the influence of a high positive potential, a Taylor cone in a liquid/molten state is formed at that end. The cone is then quenched upon cessation of the laser power, thus freezing the Taylor cone. The tip of the frozen Taylor cone is reheated by the laser to allow its precise localized melting and shaping. Tips thus obtained yield desirable end-forms suitable as electron field emission sources for a variety of applications. In-situ regeneration of the tip is readily accomplished. These tips can also be employed as regenerable bright ion sources using field ionization/desorption of introduced chemical species.

22 Claims, 9 Drawing Sheets

Related U.S. Application Data

(60) Provisional application No. 61/962,462, filed on Nov. 7, 2013.

(51) Int. Cl.
| | |
|---|---|
| *C23C 14/58* | (2006.01) |
| *C23C 14/24* | (2006.01) |
| *C23C 14/16* | (2006.01) |
| *C25D 3/50* | (2006.01) |
| *C25D 5/50* | (2006.01) |
| *C25D 17/00* | (2006.01) |
| *H01J 37/073* | (2006.01) |
| *H01J 37/08* | (2006.01) |
| *H05G 2/00* | (2006.01) |
| *H01J 1/304* | (2006.01) |
| *B21C 1/16* | (2006.01) |

(52) U.S. Cl.
CPC ............ *C23C 14/5806* (2013.01); *C25D 3/50* (2013.01); *C25D 5/50* (2013.01); *C25D 17/00* (2013.01); *H01J 1/3044* (2013.01); *H01J 37/073* (2013.01); *H01J 37/08* (2013.01); *H05G 2/005* (2013.01); *B21C 1/16* (2013.01); *H01J 2201/30411* (2013.01); *H01J 2209/0226* (2013.01); *H01J 2237/0802* (2013.01); *H01J 2237/0805* (2013.01)

(56) References Cited

U.S. PATENT DOCUMENTS

| | | | |
|---|---|---|---|
| 4,829,177 | A | 5/1989 | Hirsch |
| 5,153,901 | A | 10/1992 | Shoulders |
| 5,554,859 | A | 9/1996 | Tsukamoto et al. |
| 7,501,644 | B2 | 3/2009 | Zani et al. |
| 7,827,779 | B1 | 11/2010 | Krishnan et al. |
| 8,080,930 | B2 | 12/2011 | King |
| 9,524,848 | B2 * | 12/2016 | Hirsch .................. H01J 37/073 |
| 2003/0052268 | A1 | 3/2003 | Doroshenko et al. |
| 2003/0119246 | A1 | 6/2003 | Ahn et al. |
| 2005/0111624 | A1 | 5/2005 | Yada et al. |
| 2007/0274451 | A1 | 11/2007 | Harding |
| 2008/0253020 | A1* | 10/2008 | Gierak .................. G11B 9/1409 360/110 |
| 2009/0153015 | A1* | 6/2009 | King .......................... F03H 1/00 313/359.1 |
| 2009/0179161 | A1 | 7/2009 | Ward et al. |
| 2010/0181493 | A1* | 7/2010 | Sudraud .................. H01J 27/26 250/396 R |

OTHER PUBLICATIONS

Chen, L. W. et al., 'Stable Field-Induced Electron Emission from a Solidified Liquid Metal Ion Source', In: Applied Physics Letters, vol. 72, Issue 3, Jan. 19, 1998, pp. 389-391, http://scitation.aip.org/content/aip/journal/apl/72/3/10.1063/1 .120745.

Ganter, R. et al., High Current Electron Emission from Microscopic Tips, Proceedings of FEL 2006, BESSY, p. 781-784, Berlin, Germany.

Hemberg, O. et al., "Liquid-metal-jet anode electron-impact x-ray source", Applied Physics Letters, vol. 83, No. 7, Aug. 18, 2003, pp. 1483-1485.

Hirsch, Gregory, "A Bright and Durable Field-Emission Source Derived From Frozen Refractory-Metal Taylor Cones", IEEE-IVNC, Jul. 11, 2016, 2 pgs.

Hirsch, Gregory, "A Bright and Durable Field-Emission Source Derived From Frozen Refractory-Metal Taylor Cones", IEEE-IVNC 2016 University of British Clumbia, Vancouver Canada, Jul. 12, 2016, 51 pgs.

Knapp, Wolfram et al., Electron emission characteristics of solidified gold alloy liquid metal ion sources, Applied Surface Science, No. 146, 1999, p. 134-137.

Knapp, Wolfram et al., 'Formation of a Nano-Emitter for Electron Field Emission on a Liquid Metal Ion Source Tip After Solidification of the Alloy', In: Vacuum, vol. 69, Issues 1-3, Dec. 24, 2002, pp. 345-349, http://www.sciencedirect.com/science/article/pii/S0042207X02003561.

Kuo, Hong-Shi et al., "A single-atom sharp iridium tip as an emitter of gas field ion sources", Nanotechnology, vol. 20, IOP Publishiing, 2009, pp. 1-5.

Kuo, Hong-Shi et al., "Preparation and Characterization of Single-Atom Tips", Nano Letters—American Chemical Society, vol. 4, No. 12, Nov. 19, 2004, pp. 2379-2382.

Makela, Jason M. et al., Progress on Re-generable Field Emission Cathodes for Low-Power Electric Propulsion, 30th International Electric Propulsion Conference (IEPC), 2007, p. 1-9, Florence, Italy.

Ninomiya, Satoshi et al., "Vacuum electrospray of volatile liquids assisted by infrared laser irradiation", Rapid Commun. Mass Spectrometry, No. 26, 2012, pp. 863-869.

Oppelt, A. et al., "Towards a Low Emittance X-Ray FEL at PSI", Proceedings of FEL 2007, pp. 224-227, Novosibirsk, Russia.

Orloff, Jon, "The Liquid Metal Ion Source—A Hot Ion Source", University of Maryland and FEI Company, Hillsboro, Oregon, US, Oct. 1, 2012, 35 pgs.

Tajmar, M. et al., 'New Materials and Processes for Field Emission Ion and Electron Emitters', In: CEAS Space Journal, vol. 4, Issues 1-4, Jun. 2013, pp. 47-54, http://link.springer.com/article/10.1007/s12567-013-0031-z.

Thomas, Sebastian et al., "Large optical field enhancement for nanotips with large opening angles", New Journal of Physics, vol. 17, Jun. 10, 2015, 18 pgs.

PCT-US2014-064697__InternationalSearchReportAndWrittenOpinion__dated Nov. 7, 2014.

* cited by examiner

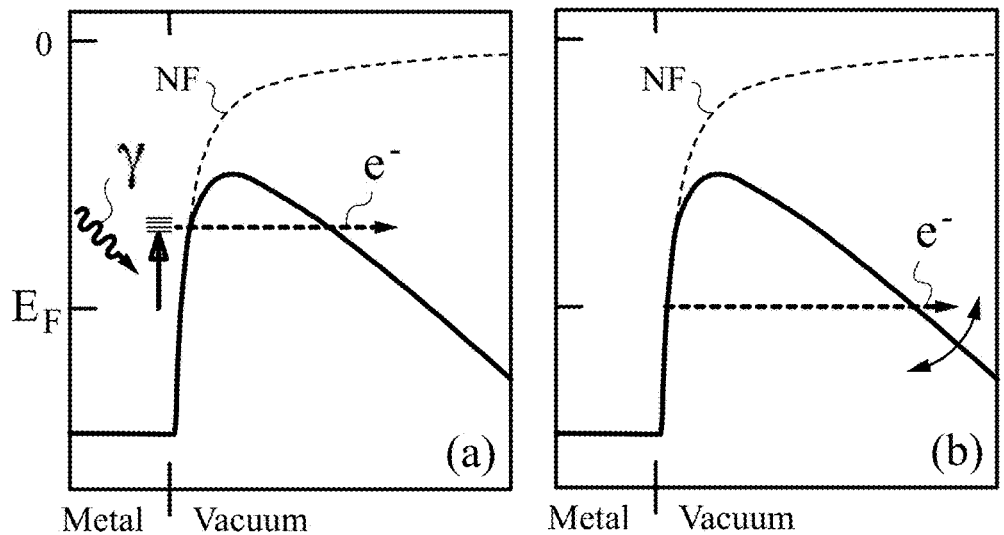
**Fig. 2A
(Prior Art)**
**Fig. 2B
(Prior Art)**
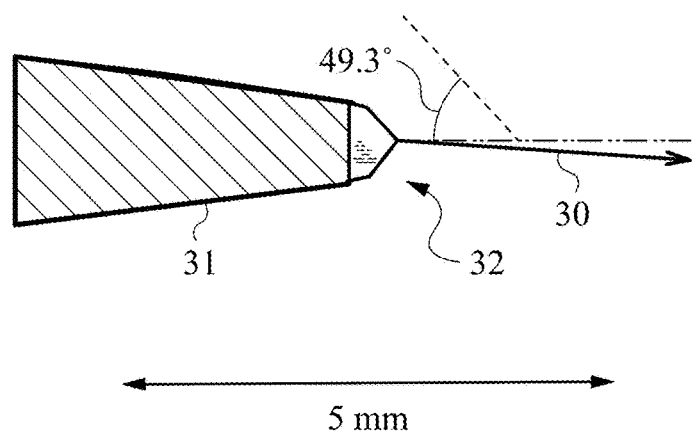
**Fig. 3
(Prior Art)**

TECHNIQUES FOR OPTIMIZING NANOTIPS DERIVED FROM FROZEN TAYLOR CONES

This application is a Continuation-in-part of now allowed, U.S. patent application Ser. No. 14/536,555 filed on Nov. 7, 2014, which claims priority from U.S. Provisional Patent Application No. 61/962,462 filed on Nov. 7, 2013 that is entitled "Bright and Durable Field-Emission Source". The above numbered applications are incorporated herein by reference in their entireties.

GOVERNMENT LICENSE RIGHTS

This invention was made with government support under Grant No. DE-SC0011345 awarded by the Department of Energy on Feb. 18, 2014.

FIELD OF THE INVENTION

This invention relates generally to providing a bright source of charged particles based on the formation of high-temperature Taylor cones. In particular, the invention teaches the creation of a bright and durable source of electrons by field emission for use in a variety of electron beam applications, such as electron microscopy, particle accelerators, x-ray sources, and microwave sources.

BACKGROUND

Prior Art

Field Emission

Achieving a reliable and extremely bright source of electrons for applications in the technical area of electron beam (e-beam) instrumentation is a known challenge. At the core of every electron gun used in these sophisticated instruments is the actual source of charged particles. The brightest existing electron sources use the physical process of field emission to liberate electrons from a cathode. This is the first step for the creation of an electron beam from a complete electron gun system. Field emission is a deceptively simple technology first developed in the 1930s. A very sharp needle-like emitter is used as the source of electrons. The radius of curvature at the emitter tip is generally below 1 micron, and often less than 0.1 micron. These small and needle like tips which are the focus of the present invention are also sometimes referred to as nanotips. By placing a high negative voltage on the emitter, electrons are extracted at room temperature from the nanotip by the quantum mechanical process of tunneling. Due to the very small effective source size and very high current densities that are achievable, field emitters are the brightest existing electron sources.

Unfortunately, field emission sources are notoriously unstable during operation due to gas contamination in the imperfect vacuum environment of the instrument. Additionally, they sustain damage to their tiny emitter tips due to energetic ions created by collisions of emitted electrons with residual gas atoms. Electron Stimulated Desorption (ESD) from the anode and other solid structures that electrons encounter also contribute to this ion flux. The resulting damage (sputtering) can very rapidly lead to the complete destruction of a field-emission tip. Thus, despite their unmatched brightness, field-emission sources have not become as ubiquitous as one might have expected owing to these longstanding issues with operational reliability and lifetime. To achieve a reasonable lifetime, a field-emission gun must be operated under ultra-high vacuum (UHV) conditions. This is costly and undesirable from the point of view of operational convenience.

When a field emitter fails, the electron gun must be brought up to atmospheric pressure, the field emitter replaced, and the system subsequently pumped back down into the UHV range. This process can take over a day due to these extremely stringent vacuum conditions. Accordingly, most electron microscopes use significantly less-bright thermionic emission cathodes in which electrons are emitted by a heated solid. Relatively modest vacuum conditions are adequate for such instruments. A field-emission source having unmatched brightness, high reliability, less reliance on ultra-high vacuum conditions, and extremely long lifetime would be of significant benefit to electron microscopes and other e-beam instrumentation.

Field emitters are most commonly fabricated by electrochemical etching of metal wires. A narrowly tapering cone results in an opening angle that is usually just a few degrees. tungsten or other refractory metals are generally used. Because the work function varies considerably on different crystal planes of a material, the use of single-crystal wires with a specific orientation is sometimes employed in order to confine most of the emission current to a select surface plane residing at the apex of the emitter tip. This increases the brightness and reproducibility of the source.

The end-form of the field emitter is crucial, and can be arrived at by several different processes. According to one method, the field emitter is heated to a temperature sufficient for surface diffusion of atoms to occur. This process results in a more blunted surface, with certain low-index atomic planes forming facets. The imposition of a high electric field can also be used to advantage in conjunction with heating for achieving an improved shape of the end-form by a field-induced buildup process. The introduction of low work-function materials on the tip such as zirconium oxide is also sometimes used, with subsequent heating and field buildup to form localized emission planes. Field emitters with such oxide coatings can operate at elevated temperatures to achieve field emission of electrons that are thermally excited to higher energy levels. Such "Schottky thermal field-emitters" have achieved great success in e-beam instrumentation due to their higher stability, reproducibility, and lifetime as compared to cold field-emission technology. However, they are not able to achieve as bright of an electron beam due to the higher effective source size of the emitter (virtual source size) and larger energy spread of the emitted electrons.

An alternate technique for heating a tip to form highly perfect emitter tips is field evaporation. In this process, a positive potential imposed on the emitter removes lattice atoms as positive ions at electrical field strengths of hundreds of megavolts per centimeter. This process even occurs in refractory metals at cryogenic temperatures. Field evaporation can be used to produce tips that have the highest degree of perfection, with a tip end-form showing perfect lattice planes intersecting the tip surface. In addition, all atoms of surface contamination are removed, leaving an atomically clean surface. In some cases, a single atom on the end of a field emitter can be used as the primary field-emission site, which results in the smallest possible electron source, and one having high coherence. By cooling the tip to cryogenic temperatures and adding an imaging gas, atomic resolution inspection of field-emission tips can be achieved using the technique of field ion microscopy to confirm that the desired tip structure is present.

There are a number of limitations inherent in the existing etched-wire field emitter design. The very narrow opening cone angle of the emitter shank presents three deficiencies. First, there is little radial compression of electrons into a more forward-directed beam as they leave the quasi-spherical tip and are accelerated outward. In field emission microscopy, a compression factor $\beta$ can be expressed by: $M=R/\beta r$, where M is the microscope magnification, r is the radius of curvature of the field-emitter, and R is the distance from the tip to a distant detector surface. Narrow cone angles lead to values of $\beta$ near unity, and a resulting image magnification that is close to the simple radial projection of the spherical end cap of the field emitter onto the distant imaging surface.

While a low value of $\beta$ can be desirable for field emission and field ion microscopy, large radial divergence of field emitted electrons can be less desirable in electron gun designs. Efforts to confine the usable electrons to a limited area of the emitter tip have to be provided to address this issue. A much larger cone-angle results in larger $\beta$ values, which helps to compress electron emission into a more favorable forward-directed beam. A tip with a large cone angle also requires a higher voltage to achieve the same electric field at the tip, which can be advantageous for the electron gun design.

The second issue inherent in narrow field-emitter taper is that it makes the tip more susceptible to mechanical vibration. If the tip is vibrating laterally, this is equivalent to having a larger effective source and lower resultant brightness.

The third problem with narrow tapers is the poor heat conduction of the shank. This is an issue affecting the removal of heat that is input from a laser when employing the method of laser-assisted field emission. In this process, laser light incident on a field emitter is used to produce short electron pulses synchronized with the light. A wide cone angle is much more effective for heat dissipation, and permits higher incident laser powers before reaching damage threshold.

The physics involved in laser-assisted field emission is rather complex. It depends on photon energy, material work function, ambient temperature, laser intensity and electric field at the tip. In the conceptually simplest case, an electron absorbs enough energy to exceed the work function, and is emitted by classical photoemission, rather than field emission. Due to the very high electric fields present, the effective work function at the emitter tip is lowered by the Schottky effect. Electrons may also acquire sufficient energy to exceed the barrier height by multiphoton absorption. Thus, even infrared photons having much less energy than the work function may generate photoelectrons from a field emitter when high peak-power is used. This type of conventional photoemission from a tip is often of less interest for Ultrafast Electron Microscopy (UEM) application than two other processes known as "photofield emission" and "optical field-emission".

In photofield emission, an electron acquires energy at an intermediate bound state above the Fermi level ($E_F$), which is insufficient for standard photoemission. Field emission by tunneling through the potential barrier allows the excited electron to be emitted (also see FIGS. 2A&2B). The voltage on the field emitter is biased to be low enough, so that relatively few electrons are able to tunnel through the comparatively wide potential barrier from Fermi level $E_F$. Instead, almost all the emitted electrons are those excited to a higher energy by the laser pulse, where the barrier is thinner and the tunneling probability is increased. In optical field-emission, the oscillating electric field of the laser light is superimposed on the applied electrostatic field, and this modulates the barrier width itself at the laser light frequency.

Barrier thinning from the optical field of the laser light increases field emission. In this type of emission, electrons can tunnel directly from Fermi level $E_F$ if the barrier is thin enough. The polarization direction of the laser light is clearly crucial in this case. A very interesting aspect of this process is that electron emission can have a timing precision less than a single photon oscillation period due to the non-linearity of the tunneling process. Barrier penetration and emission mainly occurs at the peak of the optical electrical field. Electron pulses in the attosecond range are conceivable using this effect. It should be understood that several of these different field emission regimes can occur simultaneously. The relative percentage of electrons produced by the separate emission processes is determined by the particular physical parameters existing at the field-emission tip.

Turning our attention back to the types of field emitters, in addition to the etched-wire field emitters, several other types of field emitters have been developed. The main impetus for much of this work has been to make field-emission arrays for display purposes, which have many thousands of emitting tips. However, the possibility of using individual tips in these technologies is conceivable. There are several types of very thin whiskers that have been developed for field emission applications, the best known among these being carbon nanotubes. They have been used both as single field-emitters, as well as area arrays. Metal whiskers have also been studied for similar use. Some work has been done with the attachment of single carbon nanotubes to the end of a standard field emitter.

Another field emission device is the Spindt cathode. In this technology, very small metal cones are grown by a vacuum-evaporation process through a mask composed of many small holes in a regular array. Typically, cone sizes are on the order of only 1 μm in both height and base diameter. The packing density of these arrays can be very large, with tip spacing of a few microns. The reduced operating voltage of Spindt cathodes is convenient for some applications, and helps to reduce the rate of sputtering damage. However, the low operating voltage can present some issues for electron gun design. This type of cathode does not appear promising for making a bright field-emission gun. In addition to the metal cones of the Spindt cathode, similar structures have been produced with other materials. Diamond cone arrays in particular are a very interesting field emission source, but again, do not appear to be a promising technology for electron guns.

Ultrafast Electron Microscope

Most applications of field emission have used either continuous e-beams, or beams with relatively long pulse durations (milliseconds or longer). However, there are some applications that require electron pulses having much shorter pulses. In particular, remarkable advances in electron microscopy have permitted atomic-resolution imaging and diffraction studies of dynamic processes with temporal resolution below one microsecond, and extending even into the low femtosecond range. The general method has been termed Ultrafast Electron Microscopy (UEM), or sometimes 4D UEM to indicate that the fourth dimension of time is also being observed.

In UEM, millions of separate ultrashort electron pulses can be deployed to collect data sets from a rapidly changing sample using a stroboscopic type of investigation. In some cases, single electrons are used for each pulse to achieve the desired instrumental performance. A modified Transmission Electron Microscope (TEM) is used to realize UEM capabilities. This requires an electron gun that can produce extremely short duration electron pulses at high repetition rates, and with extraordinarily accurate timing precision. As one might expect with such a stroboscopic method, these measurements usually require the observation of processes that are reversible in nature between each incident electron bunch.

For investigations of irreversible processes, a single intense electron pulse may be employed to obtain useful data in a single shot. In this case, Coulomb repulsion in the high-density electron bunch limits temporal resolution to more modest levels that are generally in the nanosecond range. Such single-shot imaging has been termed Dynamic Transmission Electron Microscopy (DTEM). Of interest in the context of the present invention, we consider the several existing versions of UEM, as well as Ultrafast Electron Diffraction (UEC), and Ultrafast Electron Crystallography (UEC) under the blanket term: UEM. Although these different techniques observe samples using slightly different experimental configurations, they all share the commonality of probing samples with ultrashort electron pulses. Another related technique known as Photon Induced Near-Field Electron Microscopy (PINEM) also employs ultrashort electron pulses and is therefore considered to be a version of UEM in the context of this invention.

Among UEM instruments, there have been several approaches developed to produce the requisite pulsed electron beams. All methods rely on some form of photoemission. In the simplest case, this involves electrons liberated from an essentially flat photocathode that is driven by very short-duration laser pulses. This category includes conical Lanthanum Hexaboride ($LaB_6$) cathodes with a truncated microflat tip. With standard mode locking techniques, laser pulses can be as short as a few femtoseconds and repetition rates can exceed 1 MHz. For single-shot imaging, a low repetition-rate pulsed laser with a pulse length in the nanosecond or picosecond range, and much higher pulse energy is generally used. To observe processes with high temporal resolution, a pump-probe experimental arrangement is implemented by using the laser pulses to also activate the dynamic process being studied. The evolution of the sample is observed by varying the delay times between the optical pulse that initiates sample change and the incident light that initiates the electron bunch from the electron source.

A key technical challenge for advancing this field is obtaining electron pulses that broaden as little in duration as possible compared to the instigating laser pulse. A fundamental and limiting issue with femtosecond electron sources involves the Coulomb repulsion of electrons in the bunch. This phenomenon of space charge is a serious impediment for achieving the shortest possible pulse durations. Pulse broadening is greatest when the electrons are at relatively low energies near the cathode. Thus, it is advantageous to use as large of an accelerating electric field gradient as possible to reduce the time period during which the electron bunch is at low kinetic energy.

In the case of photoemission cathodes, the use of microwave cavities having large internal electric fields has been found advantageous to minimize pulse broadening. Using single electron packets is an alternative and very effective approach to address the issue of space charge. There is obviously no Coulomb repulsion in a packet if only one electron is present. Of course, this requires many more pulses to get a reasonable signal-to-noise ratio. In the case of single electron pulses, temporal resolution is still determined by the laser pulse duration and any statistical variation in the delay time between the pulse absorption and the electron emission event.

A very desirable source of ultrafast electron pulses employs laser-assisted field emission from an extremely sharp needle-like field emitter. The very high electric field at the emitter tip (over 10 MV/cm) is advantageous for reducing space charge pulse broadening, as most of the acceleration would take place within a few tip radii in this geometry. As with flat photocathodes, this quasi-point source emits electron bunches in synchronization with ultra-short photon pulses from a mode-locked laser to illuminate the minuscule emitter tip. A field-emission cathode thus described is able to produce extremely short pulse durations, while exhibiting superior brightness and coherence due to very low source emittance.

Taylor Cones

The technology of this invention relies on the Taylor cone phenomenon. It is named for Sir Geoffrey Taylor, who in 1964 analyzed what occurs in electrified liquids as electrical charge is increased. He found that a spherical liquid surface gradually becomes more elongated from electrostatic stress until instability sets in at a certain threshold value. At that point, the liquid spontaneously assumes the shape of a cone having a half-opening angle, or simply a half-angle, calculated to be 49.3°. This theoretical analysis very closely matches experimental results. The observation of such cones dates back many decades to Taylor's work. The liquid in question can be an isolated droplet, fluid on a solid surface, or the liquid meniscus at the end of a capillary tube.

In most cases, the very high electric field at the apex of the Taylor cone will produce a narrow jet of materials, which has been used for processes such as electrospraying and electrospinning. With liquid metals that have appreciably higher surface tension, the results can be different. Instead of producing an electrified jet of material, field evaporation of individual metal ions occurs from a very small cone apex. This type of Taylor cone is commonly known as a Liquid Metal Ion Source (LMIS). It has found productive application in Focused Ion Beam (FIB) systems for nanofabrication. They have also been studied for spacecraft thrusters. The size of the emitting region at low emission current is believed to be extremely small—near 1 nanometer in some cases. To produce an LMIS, one simply increases the voltage on a liquid metal surface located on a small tip until a Taylor cone forms. The metal can reside at the end of a small capillary tube filled with the liquid, or it can be a thin film that wets an underlying solid structure. The latter design is now the standard in LMIS technology, as it generally demonstrates better stability than the capillary source. The most common materials used are the low melting point metals: indium, gallium, tin, and some alloys.

Since Taylor cone formation is polarity independent, a rather obvious idea is to simply reverse the potential of an LMIS, and thereby produce electron field emission from the liquid tip. Such a liquid field emission source would be very attractive because of its complete immunity from sputtering damage. Unfortunately, realizing this is not as straightforward as hoped. In most cases, attempts to form liquid metal electron sources leads to explosive pulsed emission, rather than a constant and stable current. It has been occasionally possible to get stable electron emission using extremely small tip dimensions, and/or employing unusual materials such as liquid Lithium. At present, a practical and reliable liquid-metal field emission source remains elusive.

A different concept for using a Taylor cone for electron emission is to operate a LMIS in its normal manner, and let the temperature drop while ion emission is occurring. One might expect that a frozen Taylor cone would result, which could then be used as a field emitter by simply reversing the polarity. This approach has been shown to work to some degree by several investigations as far back as 1978. More recently, the use of such structures has been proposed for spacecraft thrusters. indium has been the most commonly used metal for this work.

Unfortunately, the formation of these frozen field emitters is rather unpredictable and the morphology of the frozen structure is quite irregular. The time interval between the removal of heat to the LMIS and complete solidification is relatively long, which results in an emitter shape that is far from the original liquid Taylor cone shape and surface smoothness. Crystalline grain growth and the reality that metal is still field evaporating from the tip during the slow freezing process are responsible for an alteration from the desirable highly perfect Taylor cone geometry. The prior art is silent about techniques for preserving characteristics such as geometry, shape, surface smoothness of a frozen Taylor cone to closely match those of an operating liquid Taylor cone.

The reader is referred to the state of the art as illustrated in FIGS. 1-5. FIG. 1 illustrates a typical UEM system 10. Femtosecond pulses from a mode locked laser 12 are directed at a photocathode 14 to produce ultrashort electron pulses 16. The laser light is split into multiple paths 18, 20 to be directed at photocathode 16 and at a sample 22 with a variable optical time delay 21 to initiate dynamic processes to obtain a time sequence 23 at high spatial and temporal resolution. This pump-probe experimental arrangement is suitable for reversible processes. Irreversible processes can be investigated using a single intense electron pulse.

FIGS. 2A and 2B illustrate photofield emission and optical field emission energy diagrams respectively. In photofield emission, illustrated in FIG. 2A, an electron is excited by a laser photon γ to an intermediate state and then tunnels through the potential barrier. In optical field emission, illustrated in FIG. 2B, the laser field modulates the barrier width. If the barrier is sufficiently thin, electrons tunnel from the Fermi level $E_F$. This process is dominant for high fields. Dashed line NF represents the potential barrier in the absence of applied field.

FIG. 3 shows a fluid jet 30 drawn from a Taylor cone 32 in the process of electrospinning. In this example Taylor cone 32 is the meniscus residing at the end of a capillary tube 31. The fluid in a typical case is an aqueous solution. The approximately 49.3° half-opening cone angle or half-angle calculated by Taylor is evident on the liquid cone and is indicated with reference to the center axis drawn in a dashed and dotted line.

FIGS. 4A&4B show 1 MeV TEM images of an operating LMIS in accordance with the prior art. The liquid in this case is a eutectic Au—Si alloy with a melting point of 363° C. Both Au and Si field evaporate during operation. In FIG. 4A the ion current being drawn from the Taylor cone in the shown image is on the order of 10 µA. In FIG. 4B the current is roughly 100 µA. As is clearly apparent, higher ion currents cause narrowing of cone angle and cusping near the tip region. At very high emission currents, an extremely fine and short liquid jet also forms, with field evaporation occurring at the end of the jet.

FIG. 5A-B illustrate the formation of local domains as observed in the prior art when a liquid metal Taylor cone employing a metal with a low melting-point is frozen or when heat is dissipated from the liquid metal Taylor cone gradually and inefficiently, resulting in an imperfect profile and poor smoothness of the Taylor cone as it freezes. FIG. 5A is an illustrative drawing while FIG. 5B is an actual micrograph of the imperfect tip. Such a frozen Taylor cone is undesirable as a field-emitter tip. As mentioned, the prior art does not teach techniques for preserving the desirable characteristics of a liquid Taylor cone while it freezes into a frozen Taylor cone.

Objects of the Invention

In view of the shortcomings of the prior art, it is an object of the invention to produce a nanoscale emitter tip or a nanotip that is more reliably and cost-effectively produced, and is more economical to operate than is possible with prior art approaches.

It is further an object of the invention to use such a tip as a source of charged particles, such as electrons, that is powerful and bright enough to be employable in a variety of industrial applications.

It is still another object of the invention to be able to replace the emitter tip of such an electron source in-situ, so that the downtime required to replace the tip of a field-emitter is greatly reduced, compared to the techniques currently available.

It is yet another object of the invention to use such an electron source in a complete electron gun that in turn can be used in a variety of industrial applications.

These and other objects and advantages of the present invention will become apparent upon review of the detailed description and the appended drawing figures.

SUMMARY

The benefits of the present invention are secured by methods for producing a very bright source of charged particles based on Taylor cone formation. A high temperature liquid Taylor cone is created, which is subsequently rapidly quenched to produce a frozen Taylor cone possessing structural characteristics, including a profile, geometry and surface smoothness that are very similar to those characterizing the initial liquid Taylor cone. Rapid quenching is substantially enabled by a high flux of thermal radiation emitted from the high temperature Taylor cone after cessation of the heating source, as well as by the high thermal conduction to the Taylor cone substrate.

High cooling rates are best achieved using refractory materials, which we define for this invention as having melting points commencing at substantially 1000° C. Moreover, melting points near 2000° C. or greater are preferred for faster cooling, with melting points of over 3000° being especially well suited due to extreme radiative cooling. After solidification, further shaping of the tip/nanotip of the frozen Taylor cone is achieved by reheating the tip of the Taylor cone so that only a localized melting of the tip takes place. This allows for a fine-tuned control of the shaping or optimization of the tip, to achieve a sharp, pointed and stable form. After this shaping step, the tip is allowed to cool off to acquire its solid and operable state.

Subsequently, a post-freezing, final shaping or optimization step of the tip may be carried out using one or more of several different physical processes including: field evaporation, thermal evaporation, thermal blunting, field-induced buildup or field-buildup for short, and etching in a low pressure reactive gas. Such post-processing or post-freezing treatment can produce end-forms on the frozen Taylor cone tip ranging from blunting into a larger radius semi-spherical shape, to being etched into an atomically sharp point also sometimes referred to as a Single Atom Tip (SAT).

In the preferred embodiment, the production of the initial liquid Taylor cone is achieved by heating a solid substrate with an incident focused laser light having sufficient power to melt a small volume of an electrically conductive material in vacuum. The most practical types of lasers are optically-pumped solid state lasers, $CO_2$ gas lasers, and high power direct diode lasers. The output power of the laser can be either continuous/constant, or the output may be modulated with a time varying waveform, called an application waveform. The use of such a waveform is often advantageous for more controlled tip formation. For the purposes of this disclosure, we also simply state that the initial application of focused energy or laser "follows" an application waveform. Alternatively, a focused beam of electrons can be used instead of lasers for heating the electrically conductive material.

The heated material preferably takes the form of an elongated wire-like substrate. In some cases, a conical preform shape is provided on the substrate, which can have an opening cone angle preferably close to the Taylor cone angle. In other instances, pre-shaping of the wire substrate into a cone with a non-linear taper profile can be advantageous. In particular, a concave profile can enable optimal tip formation. Resembling an exponential horn, this type of profile appears somewhat exponential in shape and is commonly seen in more conventional field emitters. In this disclosure, we will use the term "concave cone" to describe the shape of such a concave profile. That is because of its familiar conical shape, albeit with an outer surface that is concave or depressed inwards. In all cases, the molten zone is confined to a small volume located on the unsupported end of this elongated wire-like or conical substrate.

The focused heating beam preferably impinges on the substrate at an angle that is close to being on-axis with the Taylor cone for symmetrical heating. Simultaneously with heating, or shortly thereafter, a high positive electrical potential is imposed on the substrate to electrostatically form the Taylor cone from the molten material. The use of the application waveform described above greatly helps with the formation of stable Taylor cones. Otherwise, continuous unvarying output power of the laser is more likely to produce erratic and explosive Taylor cone formation.

Then, cessation of the focused heating beam initiates cooling or freezing of the liquid Taylor cone. Rapid cooling of freezing, or quenching, can be implemented by either a sudden and complete cessation of power, or a programmed time sequence of power reduction. This cessation of incident power is modulated with or follows a cessation waveform. The use of such a cessation waveform to control the reduction of incident focused energy, is especially useful for producing monocrystalline frozen cones. If a single-crystal wire is used as the substrate, this helps preserve its crystal orientation.

Pure refractory metals are preferably the refractory materials used for the substrate. Tungsten, rhenium, tantalum, molybdenum, niobium, hafnium, and the platinum group metals are especially preferable due to their high melting points. However, any materials having sufficient electrical conductivity to form a high-temperature Taylor cone, and having sufficiently low vapor pressure for the required vacuum environment when molten, are applicable. Some alternative conductive materials to pure metals include crystalline metal alloys, glassy metal alloys, and refractory compounds such as carbides and borides of the transition metals. As also stated, single-crystal wires can also be employed to produce frozen Taylor cones having reproducible crystallographic orientation, which is highly advantageous for many applications.

In addition to melting point and thermal conductivity, the chemical reactivity of the material can have significant influence on the quality of the field emitter. This becomes especially true as vacuum conditions become less perfect. Materials that form solid oxides in particular can be more problematic than those that either do not oxidize, or form volatile oxides that readily evaporate. Thus, reactive materials like hafnium or zirconium require much better vacuum conditions than noble platinum group elements to avoid oxidation. Metals that have volatile oxides like tungsten and rhenium can work very well, as any oxide layer formed is immediately volatilized during the tip formation. Finally, some elements like tantalum that produce oxide layers that are liquid at the melting point of the metal can form good tips, as the liquid oxide tends to flow away from the tip region to leave a clean surface. In general, it is undesirable if a thin non-volatile skin of a solid oxide forms or if a thick crust forms at the surface of the hot liquid metal.

After a frozen Taylor cone is formed in place of its liquid counterpart, the laser light is turned on again, this time to melt just the tip of the frozen Taylor cone. This second application of laser light is modulated with or follows a shaping waveform. The objective of the shaping step is to obtain a localized melting of the tip of the cone, without melting the bulk of the conical base. In addition, with proper control of the shaping process, some of the interior of the conical tip can remain solid, while being overlaid with a molten exterior layer. This allows one to exercise finer-grained control over the shaping or optimization of the tip. The application, shaping and cessation waveforms mentioned above can be same/similar or chosen independently of each other.

The tip achieves its final solid form once the second application of the laser as governed by the shaping waveform, is switched off and the tip is allowed to cool. In a preferred embodiment, the application waveform and cessation waveform are pulses with a frequency in the range of 5-100 Hz. The choice of one or more of these waveforms is made so as to accomplish the best localized melting explained above, while minimizing remelting of the base and some of the interior of the solid cone. This also prevents polycrystalline growth and irregular crystal faceting at the tip. The end result is a much sharper, pointed tip resembling its liquid counterpart, than otherwise possible. As mentioned, a post-freezing, final shaping step on the tip may be carried out for further refinement of its shape and characteristics.

The tip is used as a field emitter by simply reversing the electrical potential from positive to negative. For most applications, the frozen Taylor cone may be used as a field emitter in a complete electron gun system, which also includes a number of auxiliary electrodes held at different electrical potentials to facilitate formation of a collimated electron beam. An optical microscope integrated into the electron gun facilitates inspection of the Taylor cone in both the liquid and solid states. A fiber-optic delivery system can be used for convenient introduction of laser light into the electron gun. This and all additional optics can be pre-aligned in an integrated field emission module. The temperature of the frozen Taylor cone can be near ambient laboratory temperature when functioning as a cold field emission source, or heated to a higher temperature to operate in the Schottky thermal field-emission regime. In the latter case, heating can be achieved by either resistive heating of the field-emitter support, or by using the original heating laser operating at reduced power.

The field emitter can be run at substantially constant current, or be operated in a pulsed mode. For realizing extremely short pulse durations in the nanosecond range and below, laser-assisted field emission is used. In this case, a second laser producing extremely short duration pulses illuminates the frozen Taylor cone to produce electron pulses having duration close to that of the laser. In instances for investigating irreversible processes, a very intense single pulse of electrons is produced for single-shot imaging applications. In cases where a reversible process is being studied, a repetitive train of many less intense pulses is desirable, which may consist of only a single electron in each packet.

The frozen Taylor cone structures have a multitude of uses for applications requiring bright charged particle beams in either pulsed or continuous operation. In the general area of electron microscopy, this includes Transmission Electron Microscopy (TEM), Scanning Electron Microscopy (SEM), Electron Microprobe Analysis (EMPA), and Ultrafast Electron Microscopy (UEM). One of the simplest types of microscopes is the Point Projection Electron Microscope (PPEM). In this device, the diverging electron beam from a field emitter is used to project the shadow image of a sample onto a distant detection screen. This is accomplished without the use of any intervening electron optics.

Other applications for a bright field emission source include, particle accelerator injectors, x-ray sources, and microwave sources. Extremely bright micro-focus x-ray sources employing liquid-metal-jet anodes can benefit from the present frozen Taylor cone techniques. The ability to regenerate a damaged field emission tip in-situ is highly preferable for such applications, and intrinsic to this technology. The brightness of the frozen Taylor cone source is much higher than currently used thermionic emitters for this application, and would permit correspondingly higher anode loading.

In another embodiment, it is also possible to use the refractory Taylor cone technology for positive ion beam applications when operating in the initial high-temperature liquid state under positive electrical potential. Field evaporation of ions from the refractory material occurs from the Taylor cone tip. Such a source is a high temperature version of the well-known liquid metal ion source (LMIS), which has previously been limited to use with only low melting point metals. Due to the continuous removal of material from this type of LMIS, a motion control system is preferably used for feeding the solid wire substrate into the laser focus. The instant techniques allow for using high temperature materials for LMIS applications than possible with the prior art.

In another embodiment, the frozen Taylor cone tip is used as a field ionization source or alternatively as a field desorption source. When used for field ionization purposes, a suitable gas species to be ionized is brought into proximity with the very sharp tip achieved by the instant techniques. This may be achieved simplistically by introducing low-pressure gas into the chamber where the tip resides, or by employing a variety of more refined available approaches. Such a field ionization source can be used for a multitude of applications requiring bright ion beams. When used as a field desorption source, suitable species is introduced as atoms or molecules which migrate along the cone surface to the tip where ionization occurs.

Exemplary applications of such a field ionization source include scanning ion microscopy, Rutherford scattering spectroscopy, ion milling, fabrication of nanostructures, field ionization spectrometers, Secondary Ion Mass Spectroscopy (SIMS) and ion implantation. The gas species employed for ionization in the above examples are dependent on the application. In some cases, such as scanning helium microscopes, light ions are desired due to their low sputtering yield. In other cases, such as mass spectroscopy, the gas can be virtually any mixture of chemical species being analyzed. A non-exhaustive list of gases for some exemplary applications of the field ionization source possible with the present invention include hydrogen, helium, argon, oxygen and nitrogen.

In addition to field ionization of gas species, the ionized species can also be introduced as atoms or molecules which migrate along the cone surface to the tip where ionization occurs. The ionization of such condensed surface material is sometimes referred to as field desorption, to differentiate it from field ionization of a gas species. As such, such a tip is regarded as a field desorption source. Exemplary applications of such a field desorption source include field desorption mass spectrometers. Irrespective of which field ionization/desorption application is being used, the use of the frozen Taylor cone methodology of this invention holds similar important advantages to that obtained for electron beam applications. These include the ability to restore a degraded emission tip to initial pristine conditions in-situ.

In another embodiment, a further refinement/optimization carried out on the frozen Taylor cone tip, is by coating it with a thin film of another metal. Metals in the platinum group such as palladium (Pd) or platinum (Pt) film are preferred. This technique produces a substantially Single Atom Tip (SAT) composed of atoms of the film that form an extremely sharp pyramid as a result of thermally activated/treated rearrangement of the atoms of the metal film. As atoms forming the pyramid get depleted at the tip during use, a fresh single atom tip can be regenerated in-situ using a simple process involving heating of the tip.

In yet another embodiment, the half opening-angle or half-angle of the resulting cone is kept large, so as to cause a substantial enhancement in optical near-field. This results in an ultrafast electron source suitable for applications involving shortest possible temporal ranges. The choice of metals for this embodiment preferably includes tungsten, rhenium, gold, aluminum, iridium, palladium, platinum, silicon and silver, and the choice of half-angle is preferably in the range of 30°-50°. The large characteristic opening half-angle of the Taylor cone (49.3°) is thus naturally well suited for this purpose.

The details of the invention will now be addressed in the detailed description and with reference to the drawing figures.

BRIEF DESCRIPTION OF THE DRAWING FIGURES

FIG. 2A represents the energy diagram of photofield-emission of the prior art.

FIG. 2B represents the energy diagram of optical field-emission of the prior art.

FIG. 3 is a prior art view of a fluid jet drawn from a Taylor cone in the process of electrospinning.

DETAILED DESCRIPTION

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable, similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 6A:
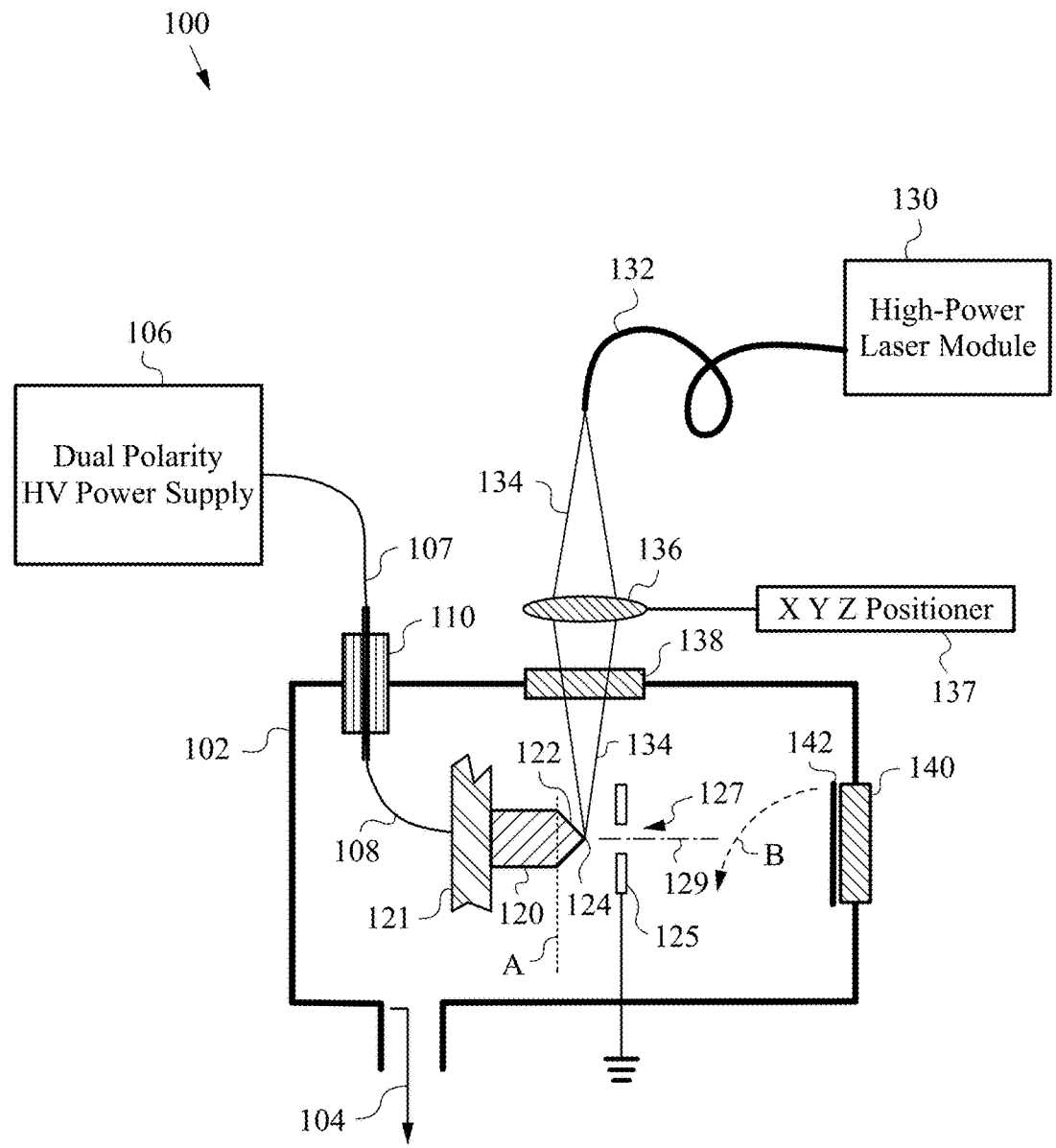
FIG. 6A is a block diagram view of the bright and durable field-emission source according to the current invention.

The present invention will be best understood by first reviewing the bright and durable field emission source 100 according to the methods of the current invention as illustrated in FIG. 6A. The bright and durable field emission source 100 represented in FIG. 6A is provided with a vacuum chamber 102 with a gas outlet 104. FIG. 6A does not show the details of a vacuum pump that will be customarily attached to outlet 104 during the creation of the vacuum in vacuum chamber 102. Such details will be obvious to skilled artisans. Bright and durable field emission source 100 is further provided with a dual-polarity high-voltage power supply 106 with a high-voltage cable 107. A feedthrough mechanism 110 serves for passing high voltage from cable 107 into vacuum chamber 102 where an electrical wire 108 is connected. Those skilled in the art will understand that a large variety of options are available to provide the requisite power supply 106, electrical wire 108 and feed-through mechanism 110. For example, wire 108 can be a copper wire and feedthrough mechanism 110 can be built with a ceramic/metal vacuum seal that transfers high voltage power between the outside environment and the vacuum inside chamber 102.

It will also be known to those skilled in the art that in a direct current (DC) environment, an electrical plate connected to the wire carrying the positive voltage or potential is customarily called the anode, and the electrical plate connected to the wire carrying the negative voltage or potential is customarily called the cathode. In FIG. 6A, the wire 108 is connected to electrically conductive material 120 of the current invention in vacuum chamber 102. Conductive material 120 is mounted on a high-temperature ceramic holder 121, as is common in such applications. The arrangement is configured such that the high voltage supplied by wire 108 is applied to conductive material 120. Note that for clarity of illustration, the relative sizes of conductive material 120, holder 121 and remaining components in chamber 102 are not drawn to scale (i.e., typically conductive material 120 is on size scales of just a few millimeters or less).

Since electrically conductive material 120 of the current invention will be used to produce electrons with dual-polarity high-voltage power supply 106 supplying negative voltage/potential to it, we will also use the term cathode when referring to electrically conductive material 120 in the below explanation. In most cases, a second electrode 125 with a central aperture 127 is positioned just in front of cathode 120. Cathode 120 is typically aligned such that its emission axis 129 is along the centerline of aperture 127. Second electrode 125 is commonly referred to as an "extractor electrode". It should be understood that electrode 125 can be either at ground potential, or it can have a positive bias when referenced to cathode 120. Furthermore, cathode 120 can actually be held at ground potential, and extractor electrode 125 can be biased positively by power supply 106. In that case, wire 108 is connected to the extractor electrode 125, rather than to the cathode. For this diagram, we are showing the case where extractor electrode 125 is at ground potential, and cathode 120 connected to the power supply.

It should be noted that in an alternative embodiment of the current invention, the electrically conductive material 120 may also be used as a Liquid Metal Ion Source (LMIS) with wire 108 supplying positive voltage or potential connected to it. In such an embodiment, electrically conductive material 120 may be referred to as an anode.

Turning our attention again to FIG. 6A, we note that the preferred embodiment of the present invention is one in which electrically conductive material 120 will be used to produce electrons according to the following teachings. In this embodiment, wire 108 from power supply 106 supplying the positive voltage or potential is connected to electrically conductive material 120. Extractor electrode 125 is held at ground potential, or at a more positive potential than 120.

According to the teachings of the present invention, a suitable electrically conductive material 120 can be a refractory metal with a high melting point. A key benefit of the current invention is that it allows the choice of high melting point refractory metals for electrically conductive material 120 as opposed to the prior art where only low melting point metals are used. Indeed, the choice of the electrical conductive materials that can be used according to the current invention is quite large. A partial list of choices includes the most refractory elements: tungsten, rhenium, tantalum, molybdenum, niobium, hafnium, the platinum group metals, and alloys composed of two or more of the preceding metals. One of the platinum group metals, iridium, is preferably used because of its special properties and high melting point.

In addition, electrically conductive material 120 can also be an alloy of refractory metals with a tendency to form metallic glass. Additionally, it can be a refractory compound, including, but not limited to, a carbide or a boride of a transition metal. The use of single crystal materials is also possible for the initial wire, which permits the production of tips having reproducible crystallographic orientations when using appropriate melting and freezing protocols. Such tip production involves a precisely controlled freezing process, which enables the crystallographic orientation of the wire substrate to be retained along the frozen Taylor cone.

As illustrated in FIG. 6A, a Taylor cone 122 is first formed at one end of electrically conductive material 120. Taylor cone 122, which is initially in its liquid form, is created with the aid of a source of focused energy to melt Taylor cone 122. In most embodiments, the focused energy will be a photon beam 134 obtained from a laser source and directed onto electrically conductive material 120. The latter is typically already in the form of a wire substrate, and laser beam 134 is incident on its free end. Melting only occurs at that end. Then a quenching process turns Taylor cone 122 from its liquid form to its frozen form. It is the frozen Taylor cone 122 that is used as a source of electrons for field emission according to the present invention. We will now describe this process in detail. We will also use the term field emitter to refer to frozen Taylor cone 122 or its tip 124, as convenient. Tip 124 is also sometimes referred to as a nanotip due to its small or nanoscale size. The use of the term tip in this disclosure will be understood to encompass the term nanotip of industry literature.

Note that in the preferred embodiment, multiple Taylor cones can be produced according to the present invention. Such multiple Taylor cones could all be produced on same holder 121 in any array as may be useful in particular industrial applications such as electron-beam lithography. However, to facilitate the following explanation, FIG. 6A shows single Taylor cone 122 and the following explanation will provide the techniques of the present invention employing this single Taylor cone 122. It will be understood by skilled artisans that this arrangement can be easily replicated to produce multiple Taylor cones, such as in an array, in accordance with the present invention.

As mentioned earlier, an advantage of the present invention over prior art is the ability to choose high melting point metals. This, in turn, allows for a faster cooling of liquid Taylor cone 122 and hence a greater likelihood of preserving its ideal or near-ideal structural characteristics, including shape/profile/geometry and smoothness. In other words, Taylor cone 122 in its liquid form, through the quenching process, transitions to Taylor cone 122 in its frozen form while preserving the structural characteristics including geometric profile and smoothness obtained in its liquid form. Such high melting point temperatures can range from approximately 1000° to 3000° or higher. Slower cooling associated with low melting point materials as demonstrated in prior art (see, e.g., FIG. 5A-B) can lead to emission tips having unpredictable faceting from crystal growth.

As already mentioned, FIG. 6A, illustrates the preferred embodiment of the invention, using single Taylor cone 122 for ease of explanation. In this embodiment a high-power laser module 130 produces a high-power laser beam 134 carried through a waveguide 132, such as a multi-mode fiber. Waveguide 132, in turn, emits laser beam 134 to be guided and shaped by a positioning and focusing lens 136. Lens 136 is further steered by an XYZ positioner 137. In conjunction with positioner 137, lens 136 allows for accurate placement and focusing of laser beam 134 onto tip 124 of Taylor cone 122 in vacuum chamber 102. In entering vacuum chamber 102 laser beam 134 also passes through a transmissive window 138. Those skilled in the art will realize that many alternative arrangements of the electrical, optical and mechanical components of FIG. 6A are possible without deviating from the principles of the present invention. For example, lens 136 and window 138 can be combined into a single optic in some embodiments. Similarly, waveguide 132 can be passed directly into vacuum chamber 102 with suitable mechanisms in the same or still other embodiments in order to avoid multiple refractive surfaces and long free-space propagation of laser beam 134. In some designs, focusing optic 136 will be one or more lenses that are situated in-vacuum. FIG. 6A is only meant to be illustrative of the basic principles being disclosed.

According to the techniques of the present invention, once suitable electrically conductive material 120, the choice of which has been explained above, is placed in vacuum chamber 102, high-power laser beam 134 is focused on its tip 124. Preferably, electrically conductive material 120 is in the form of a wire that may already exhibit a preformed shape of a cone at its unsupported end. Such a preform facilitates the initial production of Taylor cone 122 in a precise conical form having a half-opening angle or a half-angle near the 49.3° characteristic of a Taylor cone.

In a useful variation of the above embodiment, the preform shape at the wire's end is a concave cone with a narrow sharp tip. Such a cone is much narrower as compared to the half-angle of a typical Taylor cone that is subsequently formed on its very end. In other words, the outer surface of the concave cone is concave or depressed inwards or has a non-linear taper, as compared to a regular conical shape. The advantage of such a concave cone/conical end of the material/wire 120 is that it uses much less laser power for melting, and with much less volatile sublimation of metal that would otherwise get coated on the inside of chamber 102. As a result of electrical conduction, such unwanted deposition of metal on the interior of the equipment can ultimately cause electrical breakdown and failure.

It should be understood that the preforming of the end of the wire is not required for this invention. A Taylor cone can be formed directly from a molten mass at the wire end having an initially near-spherical surface. Moreover, other wire profiles with alternate taper angles or discontinuous step profiles are understood to be applicable. A Taylor cone angle is referred to as twice its half-angle. While in some texts the distinction between the two is dropped, we will continue to use the terms half-angle or half-opening angle while referring to a Taylor cone for clarity.

Laser beam 134 of FIG. 6A is powerful enough to melt electrically conductive material 120 placed in vacuum chamber 102. Once electrically conductive material 120 has been melted, simultaneously or soon thereafter, a high positive voltage or potential is generated by dual-polarity high-voltage power supply 106, and applied to material 120. We refer to the substrate portion of material 120 as the base part of Taylor cone 122. This is also called its shank or body and refers to the portion of material 120 excluding cone 122 and tip 124. In the preferred embodiment, the base is made of the same material as cone 122 and terminal/end or tip 124.

In other words, in the preferred embodiment, electrically conductive material 120, including its base/shank/body, Taylor cone 122 and tip 124 are all composed of the same high melting point electrically conductive material, such as a refractory metal. This is easily conceived, as electrically conductive material 120 typically comprises the end of a homogenously composed high melting point refractory metal wire, as per above explanation. Of course, many choices for the type and composition of electrically conductive material 120 are possible as discussed earlier.

Alternatively, the above parts may have different types and compositions. For example, the base or shank/body of electrically conductive material 120 may be selected for its own conductive, electrical and mechanical characteristics different from cone 122 and tip 124. If a different shank material or body is selected, care should be taken to ensure that no adverse effects such as its melting during the process of liquid Taylor cone formation takes place.

Returning to our preferred embodiment, a positive potential is applied to electrically conductive material 120, which may or may not have an initial conical preform. Since one end of Taylor cone 122 is melted by laser beam 134, the electrostatic forces governed by the spatial field distribution near tip 124 (the solution to which is the first-order Legendre polynomial, as will be familiar to skilled artisans) and surface tension give rise to Taylor cone 122 in its liquid form. The theory behind the formation of Taylor cones is well understood in the art, and will not be delved into detail in the present specification.

Once Taylor cone 122 has attained the desired conical structure in its liquid form, and has formed tip 124 with the desired characteristics to be able to ultimately produce a focused and bright source of electrons, high-power laser module 130 is used to shut off laser beam 134 irradiating liquid Taylor cone 122. In some embodiments, this cessation of laser beam 134 is sudden and abrupt, allowing Taylor cone 122 to immediately start to cool off, or go through the quenching process. In other embodiments, the cessation of laser beam 134 is time sequenced in order to acquire the desired characteristics of Taylor cone 122 and its tip 124.

Although it is possible to form frozen Taylor cone 122 using a continuous or constant power laser 130, it is often advantageous to use laser 130 with a time varying waveform. This can result in a more concentrated zone of heating, and a resulting smaller volume and depth of actual melted material at tip 124. This is useful in two respects. First, the quenching rate will be higher. Second, tip 124 will effectively resemble the most reliable LMIS design, which uses a solid tungsten needle with a thin film of molten gallium or indium; rather than a capillary filled with liquid metal. This thin film design is known to operate in a more stable manner. Having a larger volume of liquid metal present tends to make tip 124 more prone to generate uncontrolled spraying of droplets, rather than a well-controlled tip 124 with field evaporating ions.

In practice, one normally adjusts the laser power and voltage to produce initial Taylor cone 122. Once the proper cone shape is established, it becomes a simple task to melt the cone end to form a new tip 124 when required. Although shutting off laser 130 as fast as possible will generally result in tip 124 with the smoothest surface figure, there can be times when it is desirable to ramp the laser power down in a controlled manner, and also to adjust the applied voltage and/or current as a function of tip properties. This can produce tips with either larger radii or extremely small micro-tips due to atomic diffusion and surface rearrangement of atoms. The protocol that is followed is dependent on the material used, and exactly what tip end-form is desired for a particular application. Very precise control of the heating waveform can be achieved by modulation of the laser module 130.

One advantageous aspect of the present invention over the prior art is derived because the cooling or quenching of liquid Taylor cone 122 happens very fast and largely through radiative processes. This contrasts with the predominantly slow conductive cooling in prior art approaches, which takes substantially longer. Thus, the present invention allows the user to deploy electrically conductive material 120 with a much higher melting point than possible in the prior art. While in the prior art, the material forming the Taylor cone, as in a Liquid Metal Ion Source (LMIS), is electrically heated, such a heating source is impractical for melting material 120 with a very high melting point. Moreover, just melting the tip region 124 in infeasible using the techniques of the prior art.

Figure 5A:
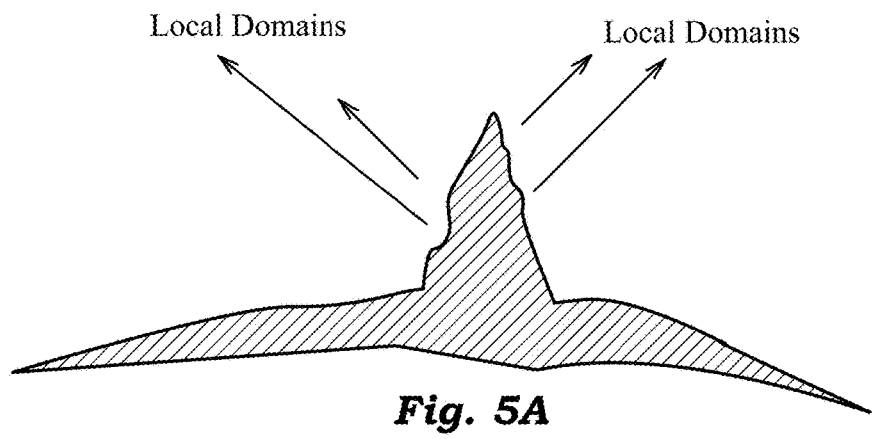
FIG. 5A is a diagram indicating the problematic local domains that emerge during the freezing of a liquid Taylor cone in the prior art.
Figure 5B:
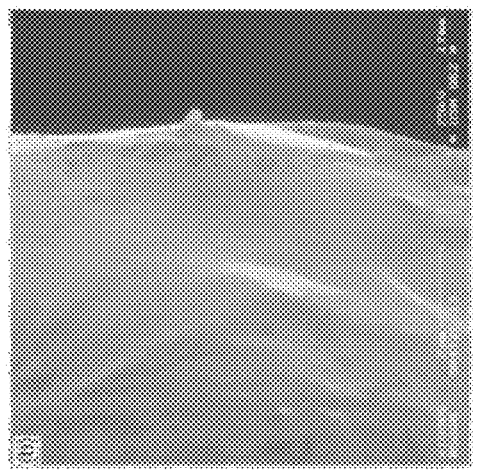
FIG. 5B is a micrograph of the imperfect tip of the prior art of a frozen Taylor cone obtained from a material with a low temperature melting-point.

Those skilled in the art will know that heating or cooling through radiation is proportional to $T^4$ where T is the temperature. Hence, the higher the temperature, the more rapidly the quenching of Taylor cone 122 of FIG. 6A will proceed. In addition, higher conductive heat transfer occurs away from tip 124 to wire substrate 120 as increasingly higher melting point material wire is employed. It is this fast quenching that allows the present invention to preserve the desired structural characteristics of Taylor cone 122 during the transition from its liquid form to its solid form. Such structural characteristics preferably include the geometric profile of Taylor cone 122 as well as its surface smoothness. These two characteristics significantly reduce and in many cases avoid the production of imperfect local domains that are observed on the surface of prior art frozen Taylor cones as represented in FIG. 5A-B. FIG. 5A is an illustrative drawing showing the local domains, while FIG. 5B is a micrograph of the imperfect tip. It should be understood that different physical processes can occur during and after the Taylor cone freezes to change the tip end-form. These include thermal evaporation, field evaporation, thermal blunting, filed-induced buildup, liquid droplet ejection and surface diffusion.

Finally, dual-polarity high-power power supply 106 is used to reverse the polarity of the applied voltage to electrically conductive material 120 and consequently to Taylor cone 122, now in its frozen form with desired structural characteristics preserved from its liquid form. In other words, instead of applying a positive potential to Taylor cone 122, power supply 106 is now used to apply a negative potential to Taylor cone 122. The negative potential is high enough to liberate electrons from tip 124 of frozen Taylor cone 122 by field emission. As with the liquid Taylor cone, the high potential can alternately be placed on extractor electrode 125. In this case, a positive potential on extractor electrode 125 is used. The electrons thus produced pass through aperture 127 of extractor electrode 125.

At this point, it should be understood that high-power laser module 130 has been switched-off as bright and durable electron source 100 is producing electrons by field emission. The process of field emission of electrons is well understood by skilled artisans. Due to the large opening angle of Taylor cone 122, electrons produced by field emission at tip 124 are directed into a more forward confined cone than those produced from standard field emitters having much smaller cone angles. In addition, the voltage required to reach sufficient field strengths for emission is higher, due to the electrostatic shielding effects of the cone material residing behind the actual emission area. This can be desirable in many electron gun designs.

The problem faced by common electron emitters of the prior art due to sputtering is well known. Field-emitters are notorious for their susceptibility to damage in use. Electrons emitted from the tip ionize residual gas atoms, which accelerate back to the emitter tip where cathodic sputtering occurs. Electron stimulated desorption from the anode and other solid structures that electrons impinge upon also contributes to this ion flux. This usually means that ultrahigh vacuum conditions are required for field-emission systems. This susceptibility to damage is the main reason that field-emission has not found as widespread use as one might expect from its apparent simplicity.

The present invention solves the sputtering problem of the field-emitter by allowing an in-situ or in-place regeneration of tip 124 of Taylor cone 122. The regeneration process is explained further. When it is determined that Taylor cone tip 124, which is the electron emitter according to the present invention, needs to be replaced, Taylor cone 122 in its liquid phase as taught above is simply reformed and quenched in-situ to regenerate a new Taylor cone 122 in frozen phase. Explained another way, once a determination to replace Taylor cone 122 has been made, field-emission is temporarily stopped by turning off the negative potential from dual-polarity high-voltage power supply 106 to electrically conductive material 120. Then laser beam 134 produced by high-power laser module 130 is switched on again to reheat electrically conductive material 120 until at least the melting point of the material.

In parallel with this process, or right after it, dual-polarity high-power power supply 106 is used to provide a high positive potential to electrically conductive material 120. This positive potential is high enough to re-form Taylor cone 122 in liquid form, where Taylor cone 122 in its frozen form used to be. Once liquid Taylor cone 122 has achieved the desired characteristics, as can be ascertained by optical inspection apparatus (not shown), laser beam 134 is turned off and quenching commences to turn Taylor cone 122 once again from its liquid form to its solid form.

Taylor cone 122 acquiring its solid form essentially constitutes replacing the field-emitter tip. Finally, electric polarity to electrically conductive material 120 is reversed to a high negative potential to again generate electrons from the newly replaced field-emitter tip or frozen Taylor cone tip 124, substantially by field-emission. This process can be repeated as many times as new emitter tips are needed. Notice that electrically conductive material 120 may be consumed and may have to be replenished over the course of the operation of bright and durable electron source 100. Preferably, this replenishment is accomplished by a motion control system (not shown) that feeds electrically conductive material 120 that is preferably in the form of a wire.

Instead of completely turning off laser beam power 130, it is alternately possible to run it at reduced power to effect heating of a frozen Taylor cone 122. As mentioned earlier, this is employed in the process of Schottky thermal field emission for producing field emission predominated from electrons that are thermally excited to energy levels above Fermi level $E_F$. This arrangement offers the advantages of thermal field emission, but with the added feature of being capable of higher emission current and brightness due to the ability of the tip to be regenerated whenever necessary. Alternately, heating the field emitter can be accomplished by simply heating the frozen emitter resistively (not shown), as is currently done with standard thermal field emitters.

Bright and durable electron source 100 of FIG. 6A further includes a viewport 140 comprising a glass window with phosphor screen. There is a phosphor shield 142 that covers the phosphor layer to protect it from being coated with evaporated material during the formation of liquid Taylor cone 122. Not shown in the FIG. 6A is an optical microscope, which is used for visual inspection of Taylor cone 122 in both the liquid and frozen states. Obviously, when in the molten state, filters are required to protect one's eyes or any electronic camera from scattered laser light, as well as the intense incandescent light from hot material 120.

Figure 6B:
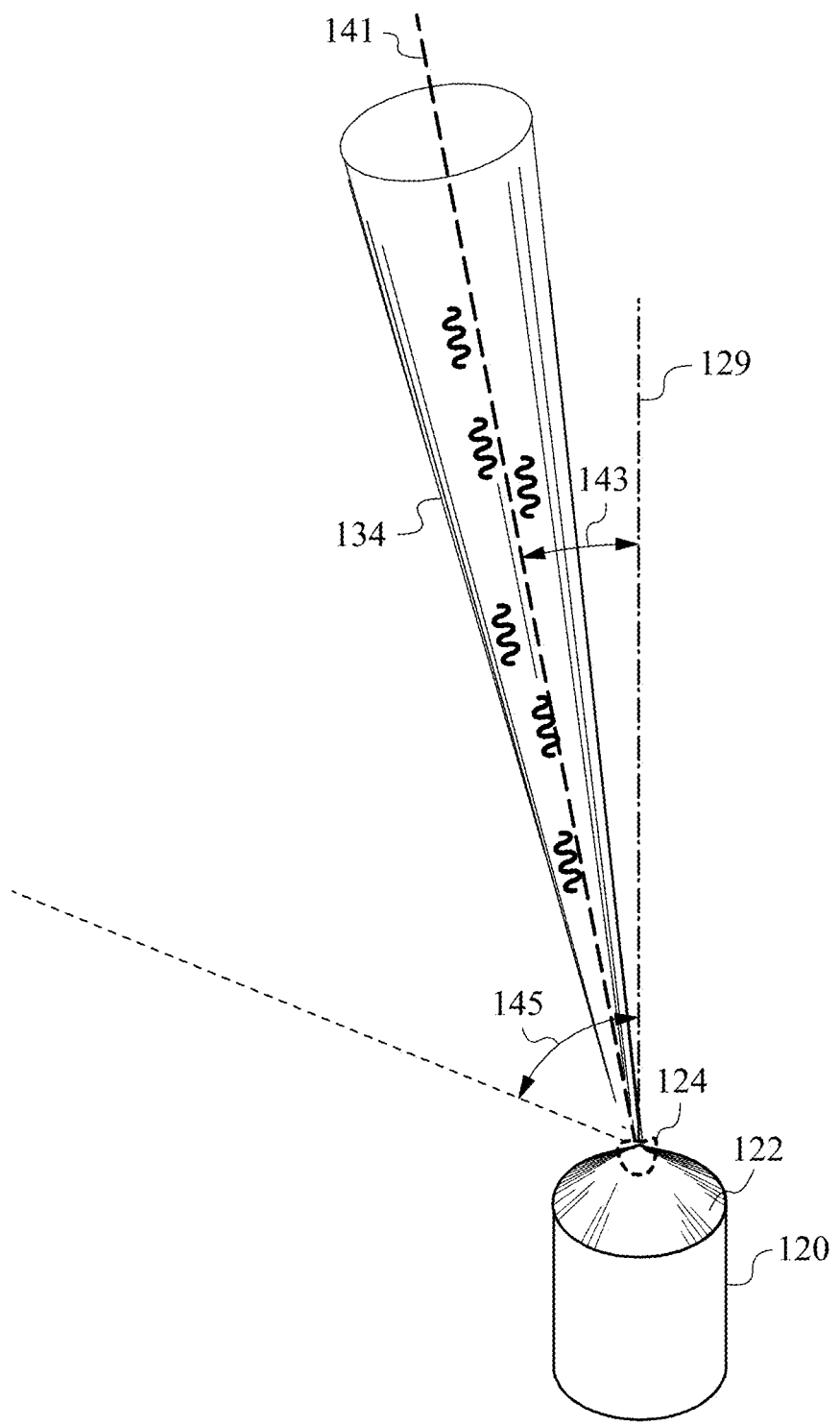
FIG. 6B shows the preferred embodiment of the present invention that focuses the laser beam on the electron emitter from an angle that is on-axis or close to on-axis with the Taylor cone.

FIG. 6B illustrates a preferred embodiment of the invention in which laser beam 134 is targeted onto electrically conductive material 120 along an optical or beam axis 141. Preferably, laser beam 134 is targeted such that beam axis 141 is as close as possible to being coaxial with emission axis 129 of Taylor cone 122. In the case shown, beam axis 141 is off emission axis 129 by a small angle 143 that is preferably less than about 6 degrees to promote symmetric and uniform heating. In other variations, this angle may be quite large. Such a large angle 145 from emission axis 129 is also shown. Angle 145 may be perpendicular or even greater than perpendicular from emission axis 129. Such a configuration may be dictated by apparatus geometry as required for an application, or in other variations where an electron beam is used to heat and melt Taylor cone 122.

Figure 7A:
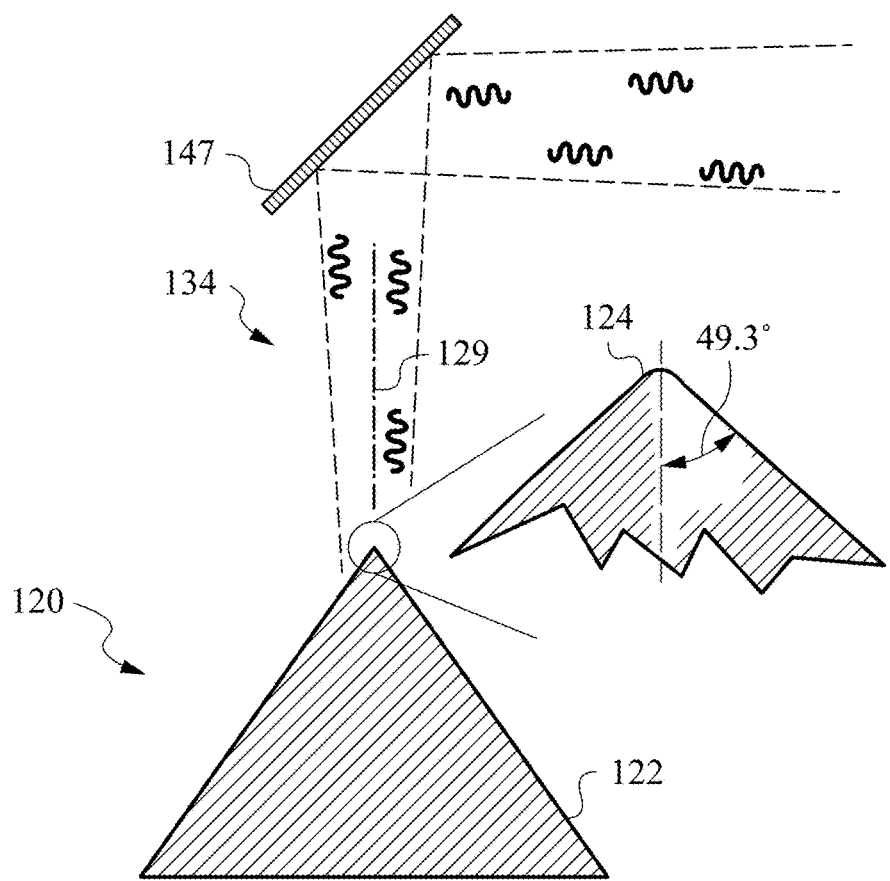
FIG. 7A shows how frozen Taylor cone of the current invention may appear upon close examination.

FIG. 7A shows in detail how frozen Taylor cone 122 may appear on close examination. In FIG. 7A, Taylor cone tip 124 is shown in an exploded view illustrating that tip 124 may not be a point, but rather a narrow and rounded surface. The characteristic Taylor cone half-opening angle or half-angle of about 49.3° is also shown. In some cases, processes such as cusping and/or any other processes discussed above and known to those skilled in the art may modify the half-opening angle substantially.

In the embodiment of FIG. 7A, a mirror 147 is used to ensure that Taylor cone 122 is irradiated by laser beam 134 from a direction preferably close to on-axis or along emission axis 129 of Taylor cone 122 to provide symmetrical heating. Clearly, this also permits laser beam 134 to enter the vacuum chamber from a direction significantly off-axis with respect to emission axis 129 of Taylor cone 122. This configuration also has the advantage of not exposing the laser focusing lenses (not shown) to material evaporating from hot tip 124. Mirror 147 can be either set in position permanently, or else moved into position when required to reform Taylor cone 122. A stationary mirror cannot be used as mirror 147 when positioned in the path of the electron beam derived from the final frozen Taylor cone 122 along its emission axis 129.

Figure 7B:
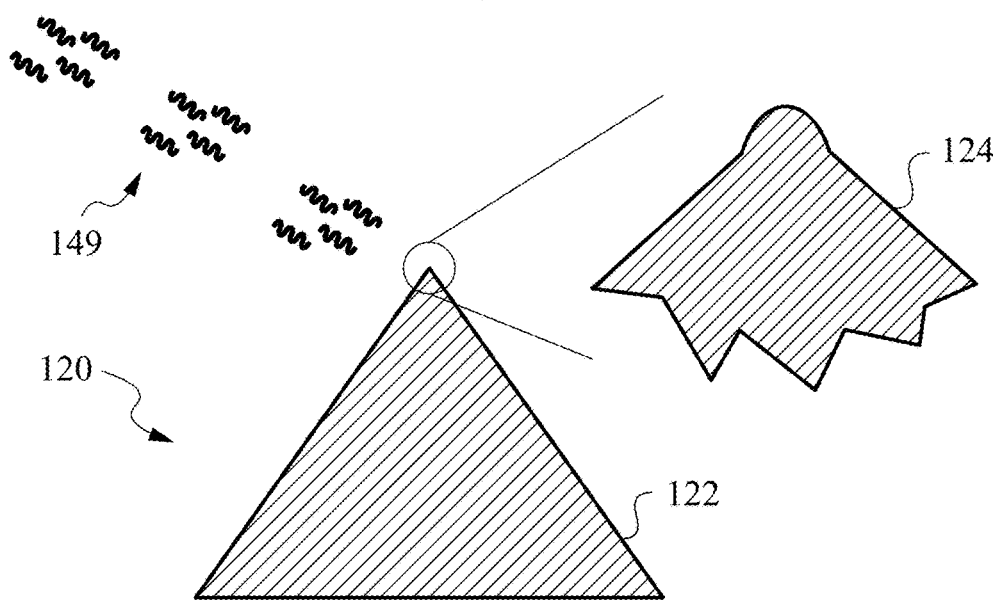
FIG. 7B shows how frozen Taylor cone of the current invention may assume a semi-spherical shape due to thermal blunting.

Notice that in FIG. 7B frozen Taylor cone 122 is being subjected to ultra-fast light pulses 149, which as explained earlier, may contribute to electron production by emitter tip 124 using the process of laser-assisted field emission.

Furthermore, FIG. 7B illustrates that Taylor cone 122 may exhibit a differently shaped tip 124 from the typically sharp one as seen in FIG. 7A. This type of tip shape may be found to develop under real operating conditions. In this case, Taylor cone tip 124 undergoes a process called thermal blunting where instead of achieving a pointed tip 124 of frozen Taylor cone 122, a semi-spherical blunted surface of tip 124 may in fact be achieved. Such a tip is sometimes desirable for producing a more uniform end-form on the tip if there is some asymmetry present when initially frozen. In addition, this can be used to produce a larger emitter radius for some high current application.

Figure 8:
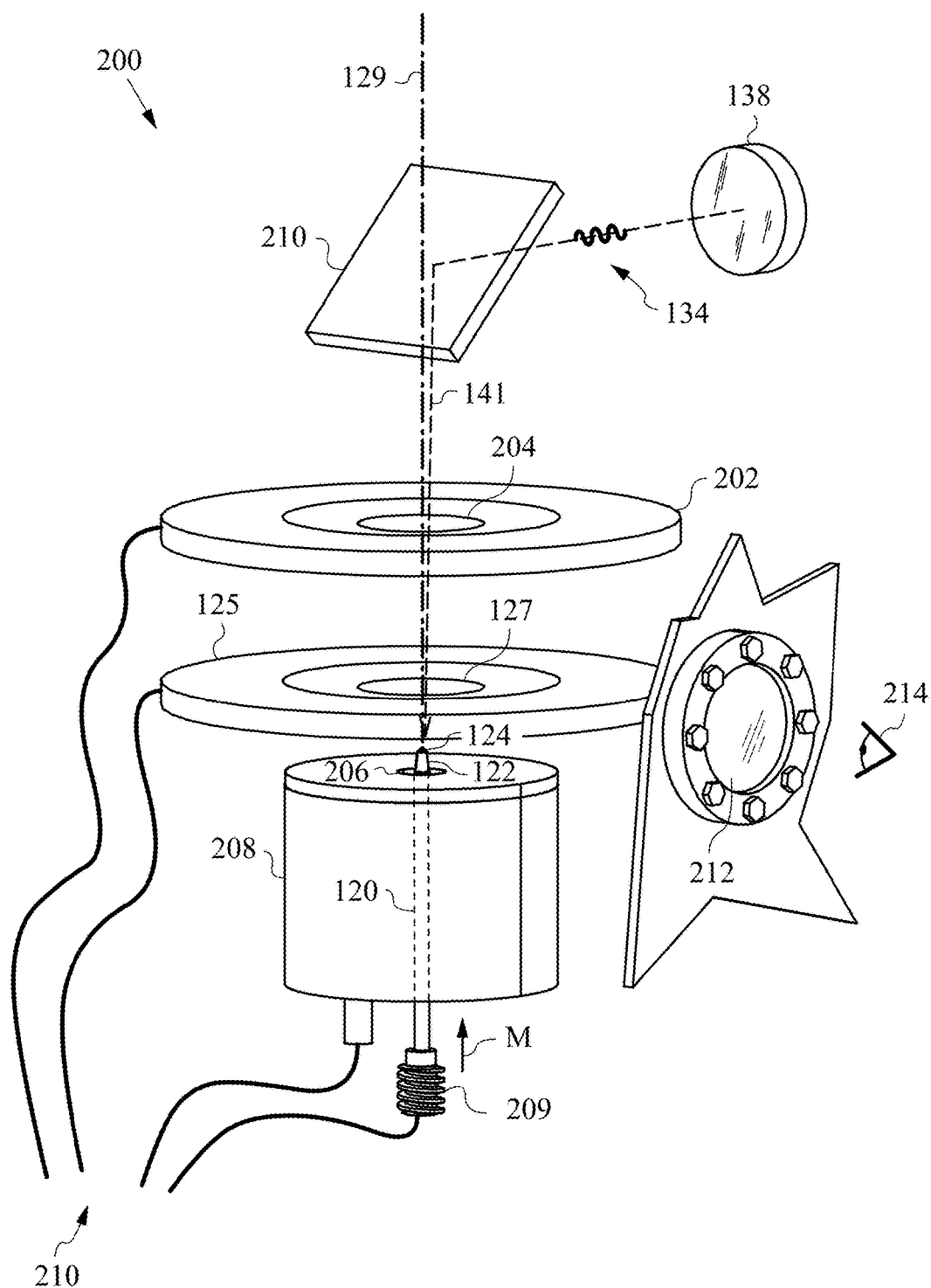
FIG. 8 shows how the bright and durable electron source of the current invention may be used in a complete electron gun.

FIG. 8 shows a preferred embodiment where the bright and durable electron source of the present invention is used in an electron gun 200. Laser beam 134 is shaped by lens 138 and reflected by removable mirror 210 such that beam axis 141 is close to being collinear with emission axis 129. Thus, light beam 134 is incident on electrically conductive material 120 and heats up its tip 124 at least to its melting point. To permit the unobstructed passage of beam 134 to tip 124 the customary extractor and anode electrodes 125 and 202 have correspondingly dimensioned holes 127, 204. As is customary in field emission guns, tip 124 of the field emitter protrudes from an aperture 206 in a suppressor electrode 208. In addition, a motion control system 209 can be deployed to move or advance wire material 120 of field emitter tip 124 in the direction indicated by arrow M. This is done to feed electrically conductive material 120 towards the laser focus as tip 124 is depleted during extended tip formation cycles and operation.

Electrical connections 210 at the back of electron gun 200 supply appropriate voltage potentials to the various electrodes and components of electron gun 200. As taught earlier, once the end of electrical conductive material has been melted by laser beam 134, Taylor cone 122 is formed in its liquid form. This Taylor cone 122 has the desired characteristics and tip 124 that in its frozen form will produce a narrow and bright beam of electrons. There are alternate means to illuminate the Taylor cone with the heating laser. The use of a mirror is advantageous for avoiding the coating of the focusing lens with evaporated material. This mirror can also be used to block such evaporated material from entering the column of the instrument. If the mirror is not movable, some sort of movable evaporation shield is desirable beyond the electron gun.

It is possible to design some sources in which the assembly is built with its optics integrated into the gun. This is best realized with a fiber-optic cable that transmits laser power to the assembly. All focusing components, including mirrors and lenses are pre-aligned on the source. In addition, a borescope or fiberscope can be a practical means for getting close optical access for viewing the Taylor cone inside the electron gun. FIG. 8 illustrates a simple viewing port 212 for an optical inspection apparatus 214.

Figure 1:
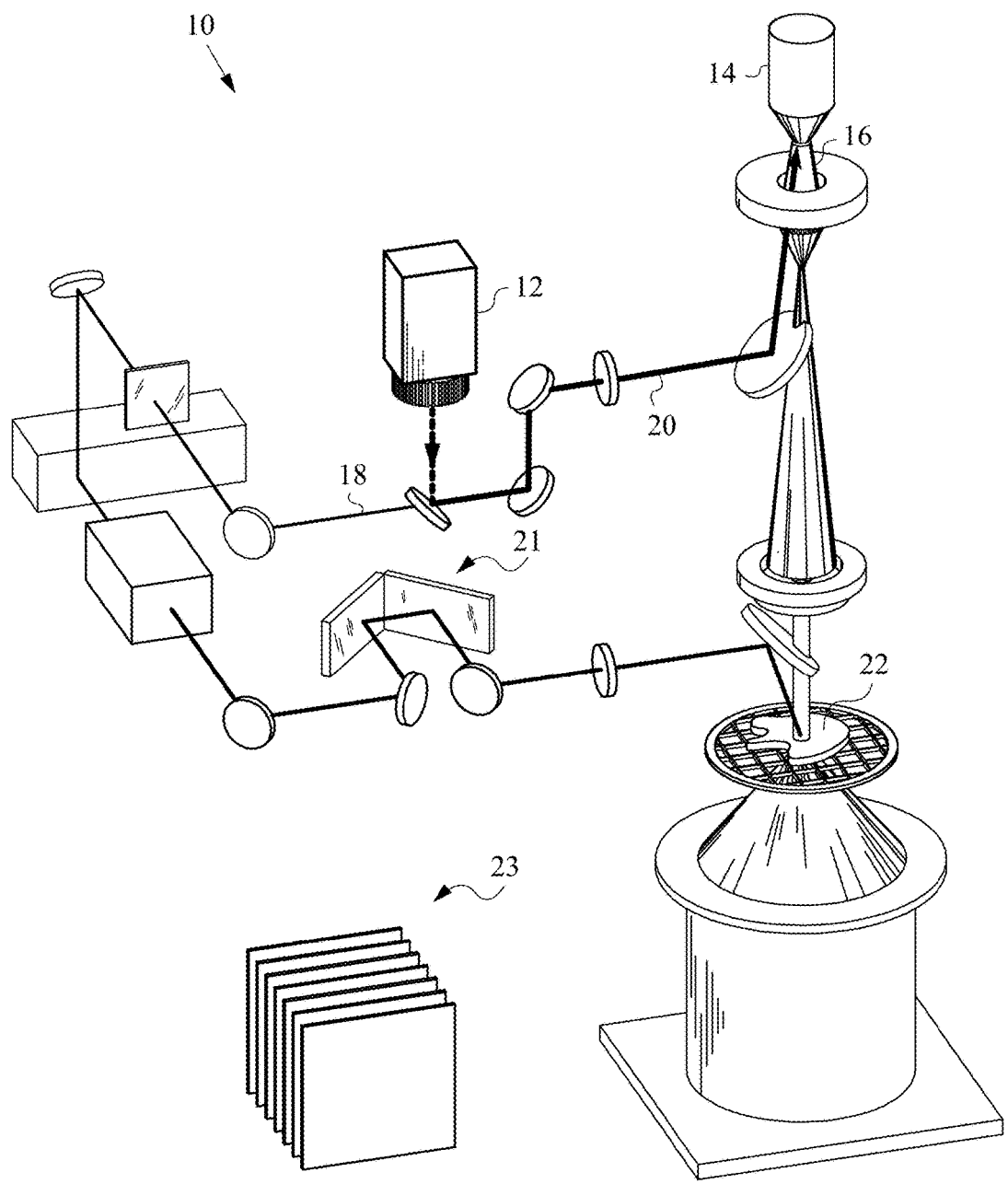
FIG. 1 illustrates a schematic diagram of a typical Ultrafast Electron Microscope (UEM) system of the prior art.
Figure 4A:
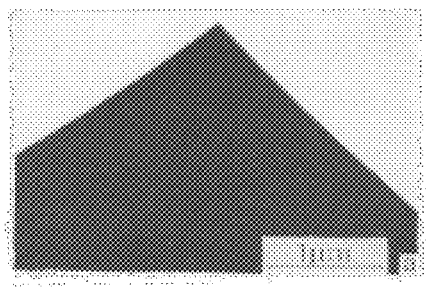
FIG. 4A is a prior art representation of 1 MeV of Transmission Electron Microscopy (TEM) images of an operating Liquid Metal Ion Source (LMIS) at two different ion currents.
Figure 4B:
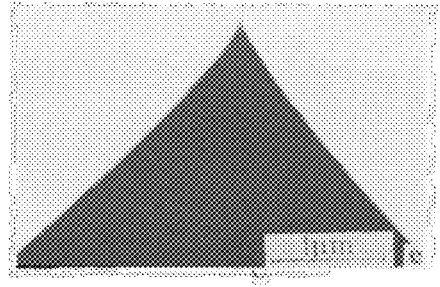
FIG. 4B is a variation of FIG. 4B under increased ion currents.

As already stated, the field emitter can be run at substantially constant current, or be operated in a pulsed mode. For realizing extremely short pulse durations in the nanosecond range and below, laser-assisted field emission is used. For laser-assisted field emission, the electron gun design is similar to that used for standard DC operation as shown in 200. However, the voltage on extractor electrode 125 is reduced to prevent strong field emission, except during the brief time when tip 124 is illuminated by very fast laser pulses. The general outline of this instrument has already been shown in FIG. 1.

As previously described, for reversible processes many individual electron bunches are used to build up an image. In some cases, each "bunch" is only a single electron. In other cases, when investigating irreversible processes, a complete image must be collected in a single shot. In such instances, a much more powerful laser pulse is used to create a very intense electron pulse. Such operation can lead to rapid deterioration of the field emitter. However, regeneration of the tip is inherently possible with this invention. In the most extreme case, an emitter might have to be regenerated between the acquisition of each image.

Figure 9A:
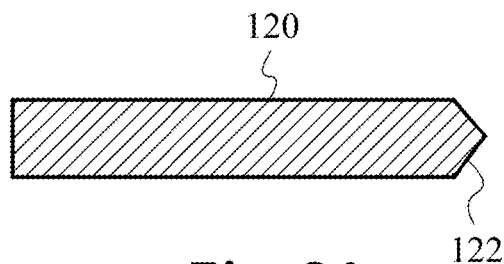
FIG. 9A shows the use of a refractory metal wire with a regular conical preform shape at its tip as the electrically conductive material used in the formation of the Taylor cone of the present invention.

FIG. 9A illustrates that electrically conductive material 120 preferably is a wire having a composition of a type of a suitable material as taught above, and further preferably has a conical preform at one end. This facilitates the production of initial liquid Taylor cone 122 as taught above, that has the desired structural characteristics to subsequently produce a frozen Taylor cone for field emission purposes.

Figure 9B:
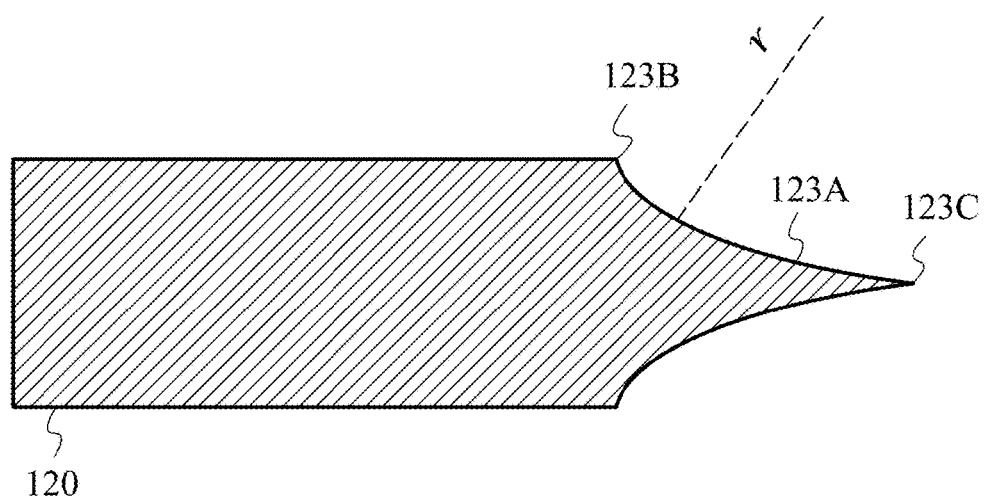
FIG. 9B shows the use of a refractory metal wire having a concave conical preform shape at its end, as the electrically conductive material used before the formation of the Taylor cone according to the invention.

FIG. 9B illustrates that electrically conductive material 120 preferably is a wire having a composition of a type of a suitable material as taught above, and further preferably has a preform at one end that has a concave cone profile. It is called a concave cone because its outer surface 123A is concave or depressed inwards as compared to a regular cone, such as liquid Taylor cone 122 of FIG. 9A. The radius of curvature r of its concave outer surface 123A as shown by the dotted line r in FIG. 9B can be constant, or varying. Such a varying radius of curvature preferably results in a substantially exponential shape of the cone, also sometimes referred to as an exponential horn. A substantially exponential tip is also used for many standard field emitters. Tip 123C of this concave cone will generally have a small radius of curvature and a small opening angle. One advantage of this shape over a linear taper with constant small opening angle and long narrow section is better mechanical stability and the resulting lower susceptibility to vibrational motion.

A concave cone preform of the wire described above facilitates the production of initial liquid Taylor cone 122 as taught above, that has the desired structural characteristics to subsequently produce a frozen Taylor cone for various applications. The concave profile permits the use of lower laser heating power, and results in less evaporated material. In a preferred variation, radius of curvature r increases from base 123B to apex/tip 123C of concave cone with outer surface 123A as shown in FIG. 9B. Stated differently, the local opening angle of the cone becomes smaller as its apex/tip 123C is approached starting from its base 123B. Most commonly, this preformed concave cone profile is produced by a purely chemical, or an electrochemical etching process.

Figure 9C:
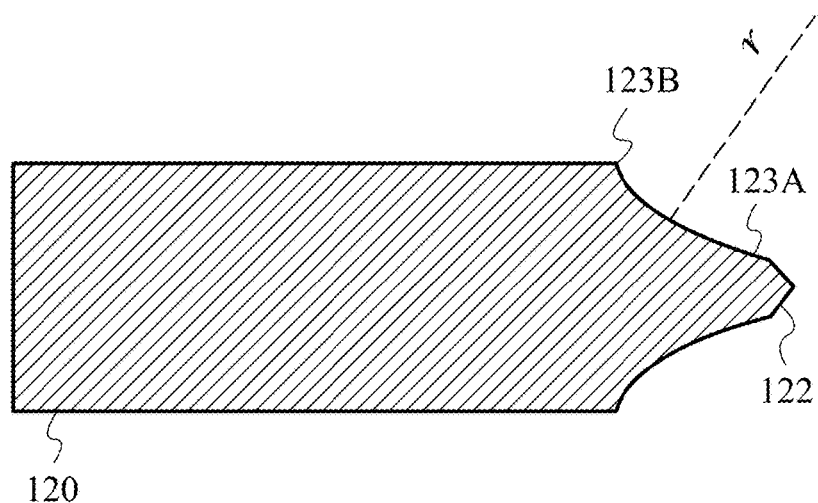
FIG. 9C shows the formation of the Taylor cone at the tip of the concave conical preform shape of FIG. 9B according to the invention.

FIG. 9C shows electrically conductive material 120 after its initial concave cone profile shape shown in FIG. 9B has been modified to form frozen Taylor cone 122 at its very apex/tip using the present techniques. In other words, tip 123C from FIG. 9B has been converted to frozen Taylor cone 122 of earlier figures according to the present techniques. The total length of the tapered section is shortened due to the surface tension forces on the locally melted tip material as well as the fact that frozen Taylor cone has a much larger opening angle than the original gradual taper of the tip region as shown in FIG. 9B.

In addition to field emission of electrons, the technology described for the formation of the field emitters can be easily adapted to realize very bright LMIS ion beams that have been heretofore impossible to achieve. Using the techniques of the invention, such an LMIS source could employ very high melting point elements compared to those used in current LMIS technology. The arrangement used is essentially identical to that shown in FIG. 6A. However, instead of dual-polarity high-voltage power supply 106, a single-polarity high-voltage power supply is adequate, since voltage reversal after the production of liquid metal Taylor cone 122 is not required. Moreover, the heating laser remains on to maintain an ion-emitting liquid Taylor cone.

The one significant difference is that wire feed system 209, as shown in FIG. 8, is much more crucial. That is due to the continuous removal of material 120 by field evaporation and thermal evaporation from the hot liquid. In comparison, for the field-emission electron source, this issue is less significant because of the limited amount of time that electrically conductive material 120 is molten. It should be appreciated that ion emission mode requires better control of Taylor cone operation to have field evaporation not be combined with the spraying of droplets of material from the tip. This is not crucial when forming frozen Taylor cones, since the goal is simply to create the best end-form of the field emitter.

Figure 10A:
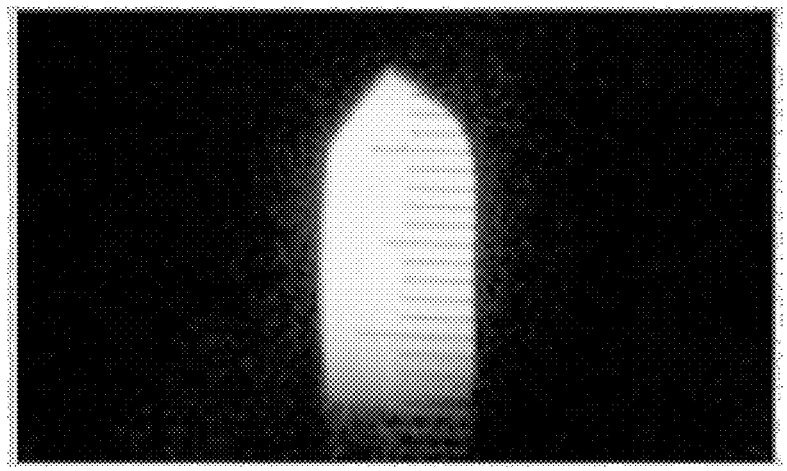
FIG. 10A is a low-resolution micrograph of a very high temperature liquid Taylor cone employing a refractory metal according to the present invention.
Figure 10B:
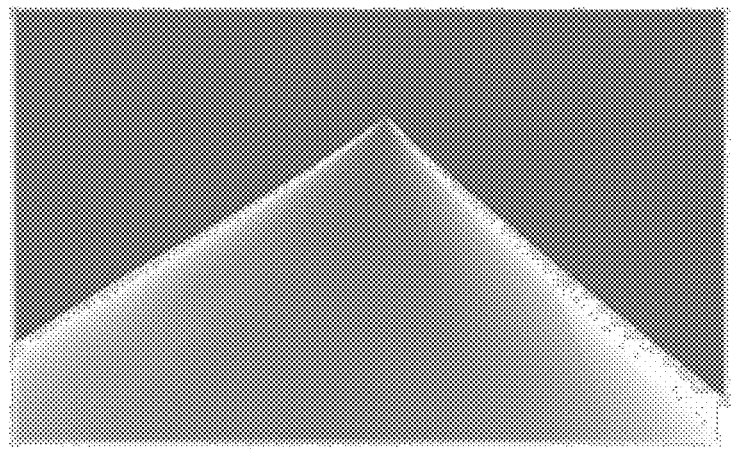
FIG. 10B is a much higher resolution and magnification SEM micrograph of a frozen Taylor cone of tungsten (melting point 3422° C.), produced by solidification of a representative liquid Taylor exemplified by FIG. 10A.

In order to further demonstrate the superior results possible by using high melting point materials according to the invention as described above, let us consider FIG. 10A-B. FIG. 10A shows a low-resolution micrograph of a very high temperature liquid Taylor cone employing a refractory metal (melting point greater than 3000° C.) according to the present invention. Because of the difficulties in photographing at very high temperatures, the image is of low resolution. FIG. 10B shows a higher resolution and magnification micrograph of the frozen Taylor cone employing tungsten (melting point 3422° C.), obtained from a representative liquid Taylor cone of FIG. 10A. Explained further, FIG. 10B shows in a micrograph form a detailed view of the frozen Taylor cone as presented earlier in the illustrative drawing of FIG. 7A. See also FIG. 7A and associated explanation.

We have already discussed that once a traditional liquid Taylor cone employing low-temperature melting point metal of the prior art and typically heated by electrical sources is frozen, its shape dramatically deteriorates. This was presented earlier in FIG. 5A and FIG. 5B and the associated explanation. The prior art frozen Taylor cone of FIG. 5A-B is strikingly poorer quality than its liquid counterpart available in the traditional art. In comparison, it is unmistakable to note that the frozen Taylor cone of FIG. 10B (and FIG. 7A) is sharp and uniform, and almost identical to its liquid counterpart shown in FIG. 10A, which if it were not for the lower resolution of FIG. 10A due to photography challenges at high temperatures, would appear sharp and uniform as FIG. 10B.

Now let us describe several enhancements to the above embodiments for further improving the results of the geometry and other characteristics, e.g. profile, smoothness and stability/durability of the frozen Taylor cones of the invention. In a highly preferred embodiment, there are various stages to the above described use of the focused energy, e.g. a laser. At first, there is an initial application of the focused energy to melt the electrically conductive material in vacuum, e.g. material 120 in vacuum chamber 102, see FIG. 6A. This initial or first application of energy is modulated with or follows a waveform that we refer to as an application waveform.

According to prior teachings, once material 120 has been melted, a positive potential is applied to it from power supply 106 via electrical wire 108, which results in the formation of a liquid Taylor cone 122 with tip 124 as shown. At this stage the initial application of laser beam 134 is ceased. This cessation of laser 134 in the present embodiment is also modulated with or follows a time-based waveform that we refer to as a cessation waveform. As already explained, this cessation causes liquid Taylor cone 120 with tip 124 to be quenched rapidly due to large radiative and conductive cooling to form a corresponding frozen Taylor cone 122 in place of its liquid counterpart.

At this stage, tip 124 of frozen Taylor cone 122 is reheated for shaping purposes. This reheating of tip 124 is again performed by incident focused energy such as a laser beam. Referring to FIG. 6A, laser beam 134 is switched on again to focus on tip 124. However, this second application of focused energy is modulated with or follows another time-based waveform that we refer to as a shaping waveform. The main purpose of the second application of the focused energy that has a shaping waveform, is to optimally shape tip 124 of frozen Taylor cone 122. This shaping or optimizing/optimization makes the resulting frozen Taylor cones and their tips obtained by the present invention further suitable for the variety of industrial applications discussed above.

The application waveform, cessation waveform, and shaping waveform mentioned above can be chosen independently of each other or not. Such an arrangement provides further fine-tuning and control over the shape and structure of the frozen Taylor cone tips. It should be noted that when we refer to a waveform above, it is meant to include any quantity/signal of the focused energy/laser as a function of time. Such a signal could be a constant value i.e. it does not change as a function of time, or it can be time-varying. Note that a constant power laser is customarily also called a continuous wave (CW) laser even though its output is continuous or fixed/constant and not a wave. One can conceivably vary the output of such a constant power laser to be modulated with the waveforms explained in these embodiments to achieve the desired tip characteristics.

As would be clear by now, that any of application, cessation and shaping waveforms may be a constant value that switches on/off like a step function, or it may be a time-varying signal. Examples of a time-varying signal/waveform include arbitrary or non-periodic signal waveforms as well as periodic waveforms. Periodic waveforms may in turn be continuous or non-continuous. There is a vast variety of such waveforms available at the disposal of those skilled in the art. For example, a short list of periodic waveforms/waves includes a sine wave (continuous), a complex wave (continuous), a triangular wave (non-continuous), a square wave (non-continuous), a pulse wave (non-continuous), a saw-tooth wave (non-continuous), etc.

In the present embodiments, the application waveform is preferably a constant value, characterized by a step function. In other words, and while referring to FIG. 6A, the initial application of laser beam 134 to melt material 120 in vacuum chamber 102 is done simply by turning on laser 134 at a constant output power level transmitted through waveguide 132 and optic 138. Laser 134 is kept at that constant level until material/wire 120 melts as per prior teachings. Once metal 120 has been properly melted, then under the influence of a positive potential applied via electrical conduit 108, a liquid Taylor cone 122 and its corresponding tip 124 are formed as per prior teachings.

Once Taylor cone 120 and tip 124 have achieved the desired characteristics and shape, laser 134 is turned off or ceased, and this cessation is preferably done by switching off laser 134. Therefore, in the current embodiment, the cessation waveform is also characterized by a step function that reduces signal value or power level of laser 134 almost instantaneously to zero. As already explained, this cessation of focused energy quenches cone 122 and tip 124 to their frozen counterparts. In a different variation however, the cessation of laser beam 134 follows a time-based cessation waveform. Subsequently, laser beam 134 is turned on again. However, this second application of laser 134 follows a shaping waveform. Preferably, the shaping waveform is a pulse wave. Preferably the duty cycle of this pulse wave is in the range of 20-80%.

The reason for using pulse waves for shaping is that they provide a higher peak power. As a result, tip 124 can be melted more precisely and controllably to achieve its refined desired characteristics. These desired characteristics include its geometry, profile, smoothness and subsequent stability during routine operation. Preferably, the shaping waveform is chosen so as to achieve the above desired characteristics of tip 124. Preferably, all of application, cessation and shaping waveforms above are chosen so as to achieve the desired characteristics of tip 124. Obviously, tip 124 achieves its final solid state once the second application of laser beam 134 (as governed by shaping waveform), is switched off and tip 124 is allowed to cool.

Preferably, the above choice of shaping waveform, is such that during the shaping process, only tip 124 melts whereas the rest of the corresponding base or body/shank of material 120 stays solid. This allows for better control over the shaping of tip 124 without it fusing into a large molten mass along with the base. Preferably, it is only tip 124 that melts while the rest of cone 122 stays solid during shaping. Preferably, all of application, cessation and shaping waveforms above are chosen so as to accomplish the above objectives.

In another variation, one or more of application, cessation and shaping waveforms are chosen so that during the shaping process, only the exterior of frozen Taylor cone 122 and/or tip 124 melt, while their corresponding interiors stay solid. Specifically, with proper control of the shaping process, some of the interior of the conical tip can remain solid, while being overlayed with a molten exterior layer. This also prevents polycrystalline growth and irregular crystal faceting at the tip. The advantage of this is that better control on the shaping of tip 124 can be exercised without collapsing it into a larger blunted spherical mass of metal if both its exterior and interior were molten simultaneously. The above techniques provide for a much better end shaping/optimization and structural characteristics of the resulting frozen Taylor cones and their tips than otherwise possible. This is because by using a more controlled waveform during shaping such as a pulsed laser, more localized melting of tip 124 can be achieved than through a constant power laser.

In a preferred variation of the above embodiments, the pulsed laser has a shaping waveform with a frequency in the range of 5-100 Hz. One of the advantages of using a different form of laser waveform than used during the initial application for melting and then its cessation for quenching, is the fact that by controlling the molten tip almost independently of the rest of the cone, enables one to carefully avoid any polycrystalline growth on the tip. Such a polycrystalline growth or irregular crystal faceting would otherwise prevent the formation of a sharp Taylor cone tip required for various industrial applications. In a highly preferred variation, the application waveform and shaping waveform are both chosen to be pulsed lasers with same/similar frequencies.

When the tip formation process is done properly, the resulting tips have almost no or very subtle crystal faceting, resulting in one central field-emission spot when such tips are used as field-emitters. As already explained, field-emission occurs when electrode potential to material 120 is switched to negative in FIG. 6A or electron gun of FIG. 8. As with prior embodiments, the ability to regenerate the frozen Taylor cone tips in-situ in the present embodiments makes the techniques of the invention an attractive choice in various practical settings.

The in-situ regeneration of tips is simply accomplished by repeating the prior steps i.e. heating electrically conductive material 120 by a first application of focused energy or laser 134 as governed by an application waveform, after desired melting is achieved and a liquid Taylor cone 122 is formed under a positive potential, ceasing focused energy or laser 134 as governed by a cessation waveform, and shaping tip 124 by heating it under focused energy or laser 134 as governed by a shaping waveform. Finally, laser 134 is turned off again to allow regenerated tip 124 to cool off and be ready for operation. The above process can be accomplished in conjunction with a wire feed mechanism already explained earlier. However, this would only be necessary after a very large number of regeneration cycles, due to the very small amount of material lost during Taylor cone regeneration.

In addition, and similar to earlier embodiments, tip 124 can be further refined using a number of refinement techniques in the present embodiments also. The application of these post processing steps can render tip 124 into an almost atomically sharp or a Single Atom Tip (SAT) form that is ideal for many industrial applications. These refinement techniques for further shaping tip 124 of FIG. 6A and FIG. 8 include thermal evaporation, field evaporation, thermal blunting, field-induced buildup and controlled etching in a chemically-reactive low pressure gas.

Thermal evaporation can be used to sublimate the frozen tip for further shaping. In thermal evaporation, the frozen tip is heated so that mass evaporation from the solid tip surface is the more dominant phenomenon than surface diffusion of atoms. This process of evaporation of mass from solid to gaseous state is used to fine-tune the shape of the tip. In field evaporation, a positive potential is applied to the emitter which removes lattice atoms as positive ions. This process can be used to produce tips that have the highest degree of perfection, with a tip end-form showing perfect lattice planes intersecting the tip surface.

Thermal blunting utilizes surface diffusion where the tip is heated in its solid form for imparting a rounded end, instead of a pointed end, to the tip. Another process is etching in a reactive gas to produce the very sharpest tips. One known example of this is heating of field emitters in oxygen to produce atomically sharp emitter tips. This has been accomplished very successfully with iridium field emitters, as will be further discussed below.

Another process is field-induced buildup or simply field buildup, where a high electrostatic field around a thermally molten tip is used for shaping. In the absence of the electrostatic field, surface diffusion of atoms on the tip's surface would cause thermal blunting. However, a strong electrostatic field at the tip polarizes surface atoms and induces a dipole moment in them. The gradient in the field acts to attract the polarized surface atoms towards the tip and produce an end-form with sharper edges and corners. This can result in a very sharp/pointed tip suitable for field emission in the frozen form. Typically, thermal blunting would cause the tip to have a bigger radius of curvature of the dome of the tip, whereas field build-up would cause it to have a more pointed end, or in other words, have a smaller radius of curvature.

The above refinement techniques/processes can be used to produce tips that are substantially atomically sharp or Single Atom Tips (SAT). As explained, these processes can be fine-tuned by adjustments to the temporal characteristics of the laser power by modulating it with various waveforms as discussed above, and/or in some cases, by also adjusting the applied potential/voltage as a function of time.

In yet another one of such post processing techniques, a metal film is deposited on frozen tip 124 of FIG. 6A and FIG. 8. Such a deposition can be achieved, for example, by vacuum evaporation. Alternatively, the deposition is achieved by electroplating. Platinum group metals are especially preferable as the deposited metal film. Preferably, the platinum group metals employed include palladium (Pd) or platinum (Pt). This technique also achieves almost a single-atom or atomically sharp and stable tip composed of atoms of the film that form an extremely sharp pyramid. Such a tip is useful for many applications, and can be regenerated by simply reheating it and letting it cool off in a controlled or gradual fashion. For a detailed discussion of this Pd/Pt electroplating technique, the reader is referred to the NPL reference "Preparation and Characterization of Single-Atom Tips", dated November, 2004 by Kuo et al., Taiwan.

An example of the above process applied in conjunction with the present invention would include an underlying tungsten substrate W(111) tip, on top of which a Pd or Pt film is deposited. The underlying W(111) tip would be created by the instant techniques provided above. On top of the underlying substrate tip, a film of Pd/Pt is deposited. The topmost Pd/Pt tip consists only of a single atom, the second layer consists of three atoms, the third layer consists of 10 atoms and the fourth layer consists of 15 atoms of such a nano-pyramid structure.

The key advantage of this process is that the faceting is thermodynamic. In other words, the SAT tip is achieved by a simple heating process. This process thermally activates a rearrangement of atoms of the metal film into substantially an SAT tip. The resulting Pt/Pd tip is stable up to the temperature of its formation, approximately 1000° K. However, if the tip is destroyed or otherwise compromised, it can be regenerated in-situ through a simple reheating process. The above described stacking of the single-atom tips remains the same after each regeneration of tip, which ultimately ensures a very long lifetime of this kind of single-atom tip depending on the thickness of the deposited Pd/Pt film.

In other variations, the resulting frozen Taylor cone tip obtained from the present techniques can also be used as a field ionization or a field desorption source by introduction of various chemical species. The chemical species can approach the cone tip for subsequent ionization from either the gas phase, or can migrate along the cone to the tip region by surface diffusion. The former case is generally referred to as field ionization, whereas the latter is called field desorption.

When used for field ionization, the very sharp tip achieved by the instant techniques attracts gas molecules to be ionized. For this purpose, the frozen tip is preferably made out of iridium. As compared to a traditional Focused Ion Beam (FIB) systems employing gallium (Ga) or indium (In), the iridium (Ir) based ionization source of the present embodiment would be significantly more stable/durable. Moreover, such a field ionization source would have a small virtual source size of approximately 1 nm and small energy spread of less than 1 eV for achieving much better resolution than LMIS type systems. Such a field ionization source would also avoid the metal contamination issue encountered in LMIS systems.

When used as a field desorption source, a suitable species to be ionized is introduced as atoms or molecules which migrate along the cone surface to the tip where ionization occurs. Exemplary applications of such a field desorption source include field desorption mass spectrometers. The chemical species applicable for use with field ionization or field desorption sources are wide ranging. In some instances, a single chemical species is used, which can be either a pure chemical element, or a more complex chemical compound. In other instances, mixtures of multiple pure chemical elements and/or chemical compounds are used. The latter situation is most commonly associated with mass spectroscopy applications.

Another key advantage of such a field ionization/desorption source would be that its tip can be regenerated in-situ by thermodynamically heating/annealing it in oxygen atmosphere. Thus, instead of or in addition to the tip regeneration techniques of the instant teachings provided above, such an exemplary Ir-SAT tip could also be reformed by high temperature annealing and oxygen induced crystal faceting. As with the prior embodiment employing W(111) substrate with Pd/Pt coating, an Ir-SAT field ionization source also exhibits a layered structure of the Ir tip in the shape of a pyramid. As the topmost tip of a single Ir atom is depleted to expose lower multi-atomic layers, the tip of the field ionization source can be heated in an oxygen atmosphere to re-expose/regain its single atom SAT form. The reheating of frozen Taylor cone Ir tip may be accomplished resistively or by a laser as per prior embodiments. The laser may be incorporated as a constant power laser or a pulsed laser, and may follow application, cessation and shaping waveforms as discussed above. Instead of iridium, other suitable metals may also be employed.

Another key advantage of such a field ionization/desorption source is that the same emitter can be used to produce different ion beams by simply changing the chemical species introduced to the vacuum system. Depending on the application, many different types of gases can be chosen. As a result, in a preferred embodiment, helium (He) or hydrogen (H) is chosen. Such a He or H based embodiment is suitable for using such a field ionization source in scanning ion microscopy. Alternatively, the He based embodiment may be used in Rutherford scattering microscope with nanoscale lateral resolution. In another variation, argon (Ar) may be used. Because of its heavier mass, such an Ar beam may be in an ion milling environment or for applications involving nanostructure fabrication.

For mass spectroscopy applications, a more complex mixture of different chemical species is generally introduced for analysis. These chemical species can approach the cone tip for subsequent ionization from either the gas phase, or can migrate along the cone to the tip region by surface diffusion. As already mentioned, the former case is generally referred to as field ionization, whereas the latter is called field desorption. In both instances, the strong electric field at the tip can enhance the supply of species due to a dipole attraction.

Still alternatively, oxygen (O) may be deployed in the present embodiment. Because of its highest secondary ion yield, such a focused oxygen beam may be used in Secondary Ion Mass Spectroscopy (SIMS). In yet another variation, nitrogen (N) may be used. The resulting focused nitrogen beam may be useful for direct nitrogen implantation applications such as for diamonds.

While studying the physics of ultrafast laser pulses interacting with nanotips, it has been found that having large opening angles for tips can produce much larger optical field enhancement than attained using standard tips with small opening angles. Explained further, the optimization/modification of tip shapes and opening angles can be used to produce large optical field enhancement. This would seem counterintuitive from a simple consideration of the electrostatic shielding factor known to occur at the tips of field emitters having large half-angles. However, the physics involved with optical fields interacting with nanotips that exhibit plasmonic response is a much more complex problem than a simple electrostatic calculation. For details of the study, the reader is referred to the NPL reference "Large optical field enhancement for nanotips with large opening angles" dated Jun. 10, 2015 by Thomas et al. and appearing in New Journal of Physics 17 (2015).

Therefore, in yet another embodiment of the present invention, the opening half-angle of the frozen Taylor cone obtained with instant techniques is large enough to cause an enhancement of the optical near field. This would result in superior operational characteristics when producing ultrafast electron pulses by laser-assisted field emission. The large characteristic half-angle of our frozen Taylor cones taught above is advantageous for that purpose. Preferably, the choice of metals includes tungsten, rhenium, gold, aluminum, iridium, palladium, platinum, silicon and silver. Preferably, the half-angle of the corresponding emitter cones is in the range of 30°-50° making Taylor cones naturally suited for such applications. Although the calculated Taylor cone angle is 49.3°, some control of the opening angle of the Taylor-cone tips can be accomplished during the initial creation of the frozen Taylor-cones and/or during subsequent modification to the frozen structure.

In general, the frozen Taylor cone structures obtained using instant techniques have a multitude of uses for applications requiring bright charged particle beams in either pulsed or continuous operation. In the general area of electron microscopy, this includes Transmission Electron Microscopy (TEM), Scanning Electron Microscopy (SEM), Electron Microprobe Analysis (EMPA), and Ultrafast Electron Microscopy (UEM). One of the simplest types of microscopes is the Point Projection Electron Microscope (PPEM). In this device, the diverging electron beam from a field emitter is used to project the shadow image of a sample onto a distant detection screen. This is accomplished without the use of any intervening electron optics.

Essentially, the above is a standard Field Emission Microscope (FEM), with the addition of a separate sample held very close to the field emitter. Magnification is simply the ratio of the tip to screen distance, divided by tip to sample distance. In addition to DC operation, this type of microscope has advantages for UEM. The close coupling of the tip to the sample minimizes some issues with broadening of the electron pulse. One issue with the PPEM approach is its susceptibility to damage from ion feedback from the nearby sample. A field emitter that can be readily reformed in-situ in accordance with this invention, therefore holds significant advantages.

Other applications for a bright field emission source include, but are not limited to, particle accelerator injectors, x-ray sources, and microwave sources. The ability to regenerate a damaged field emission tip in-situ is highly preferable for such applications, and intrinsic to this technology. The brightness of the frozen Taylor cone source is much higher than currently used thermionic emitters for this application, and would permit correspondingly higher anode loading.

As already stated, a very effective application for a bright field emission source of the above teachings is the generation of x-rays. X-ray systems employing liquid-metal-jet anodes can especially benefit from the instant technology. The result would be an extremely bright micro-focus x-ray source obtained by focusing/bombarding electrons from the field emitter of the present teachings onto a liquid-metal-jet anode. Being intrinsic to this technology, the ability to regenerate a damaged field emission tip in-situ is highly preferable for such applications. Due to significant vaporization of liquid-metal-jet material in such sources operated at very high target loading, this is a significant advantage as compared to the use of standard cathodes used for this application. The brightness of the frozen Taylor cone source is much higher than thermionic emitters (typically $LaB_6$) currently employed for this application, and would permit correspondingly higher anode loading.

In view of the above teaching, a person skilled in the art will recognize that the methods of the present invention can be embodied in many different ways in addition to those described without departing from the principles of the invention.

Therefore, the scope of the invention should be judged in view of the appended claims and their legal equivalents.

What is claimed is:

1. A method comprising the steps of:
   (a) placing at least one electrically conductive material in a vacuum, said electrically conductive material chosen to be a refractory material;
   (b) heating said at least one electrically conductive material to at least its melting point by a first application of focused energy incident on it, said first application modulated in accordance with an application waveform;
   (c) applying a positive potential to said at least one electrically conductive material to form at its end a corresponding at least one liquid Taylor cone;
   (d) quenching said at least one liquid Taylor cone by a cessation of said focused energy to form a corresponding at least one frozen Taylor cone, said cessation modulated in accordance with a cessation waveform;
   (e) heating a corresponding tip of said at least one frozen Taylor cone by a second application of focused energy incident on said corresponding tip, said second application modulated in accordance with a shaping waveform; and
   (f) obtaining structural characteristics of said at least one frozen Taylor cone to be substantially those of corresponding said at least one liquid Taylor cone.

2. The method of claim 1 whereby after said step (e), said corresponding tip of said at least one frozen Taylor cone becomes substantially atomically sharp.

3. The method of claim 1 wherein said application waveform, said cessation waveform and said shaping waveform are chosen so as to preserve in said step (e), a liquid exterior and a solid interior of said corresponding tip, thereby obtaining said structural characteristics of said at least one frozen Taylor cone.

4. The method of claim 1 wherein said application waveform, said cessation waveform and said shaping waveform are chosen so as to liquefy in said step (e), said corresponding tip of said at least one frozen Taylor cone while keeping its corresponding base solid, thereby obtaining said structural characteristics of said at least one frozen Taylor cone.

5. The method of claim 1 wherein said focused energy in one or more of steps (b), (d) and (e) comprises a laser.

6. The method of claim 5 wherein at least one of said application waveform, said cessation waveform and said shaping waveform is selected from the group consisting of a non-periodic waveform and a periodic waveform with a frequency in the range of 5 to 100 Hertz.

7. The method of claim 5, wherein at least one of said application waveform, said cessation waveform and said shaping waveform is chosen so as to avoid a polycrystalline growth on said at least one frozen Taylor cone.

8. The method of claim 1 wherein said corresponding tip of said at least one frozen Taylor cone can be regenerated in-situ.

9. The method of claim 1 wherein said at least one electrically conductive material is substantially in the form of a wire having a preformed end resembling a concave cone.

10. The method of claim 9 wherein an outer surface of said concave cone has a varying radius of curvature that increases from its base to its apex.

11. The method of claim 1 wherein said corresponding tip of said at least one frozen Taylor cone is further shaped by a process selected from the group consisting of thermal evaporation, field evaporation, thermal blunting, field-induced buildup and controlled etching in a low pressure gas.

12. The method of claim 1, wherein said corresponding tip of said at least one frozen Taylor cone is further shaped to be substantially atomically sharp by depositing a metal on said at least one frozen Taylor cone and performing thermally activated rearrangement of atoms of said metal.

13. The method of claim 12, wherein said deposited metal is selected from the platinum group metals.

14. The method of claim 1, wherein said corresponding tip of said at least one frozen Taylor cone is used as an item selected from the group consisting of a field ionization source and a field desorption source, by bringing at least one chemical species in close proximity of said corresponding tip for subsequent ionization.

15. The method of claim 14, wherein said corresponding tip is used in a process selected from the group consisting of field ionization mass spectrometry, field desorption mass spectrometry, Rutherford scattering spectroscopy, ion milling, fabrication of nanostructures, secondary ion mass spectroscopy (SIMS), focused ion beam (FIB) processing, ion implantation and scanning ion microscopy.

16. The method of claim 1, further applying a negative potential to said at least one frozen Taylor cone to liberate electrons from said corresponding tip substantially by field-emission.

17. The method of claim 16, wherein said electrons are directed onto a liquid metal jet to produce x-rays.

18. A method comprising the steps of:
(a) placing at least one electrically conductive material in a vacuum;
(b) heating said at least one electrically conductive material to at least its melting point by an application of focused energy incident on it, said application modulated in accordance with an application waveform;
(c) applying a positive potential to said at least one electrically conductive material to form at its end a liquid Taylor cone;
(d) quenching said at least one liquid Taylor cone by a cessation of said focused energy to form a corresponding at least one frozen Taylor cone;
whereby said application waveform is selected for optimizing a corresponding tip of said at least one frozen Taylor cone, said optimizing designed to cause a substantial enhancement of an optical near-field near said corresponding tip.

19. The method of claim 18, wherein said at least one electrically conductive material is chosen from the group consisting of tungsten, rhenium, gold, aluminum, iridium, palladium, platinum, silicon and silver.

20. The method of claim 18, wherein said optimizing causes a half-opening angle of said corresponding tip to be in the range of 30° to 50°.

21. A system comprising:
(a) an electrically conductive material placed in a vacuum, said electrically conductive material chosen to be a refractory metal;
(b) said electrically conductive material heated to at least its melting point by a first application of focused energy incident on it, said first application modulated in accordance with an application waveform;
(c) a liquid Taylor cone formed at an end of said electrically conductive material under the influence of a positive potential applied to it;
(d) a frozen Taylor cone formed by a cessation of said focused energy, said cessation modulated in accordance with a cessation waveform; and
(e) a tip of said frozen Taylor cone heated by a second application of focused energy incident on said tip, said second application modulated in accordance with a shaping waveform;
wherein said application waveform, said cessation waveform and said shaping waveform are chosen to obtain a substantially atomically sharp geometry of said tip.

22. The system of claim 21 wherein said tip is used as a field-emitter under the influence of a negative potential applied to said electrically conductive material, thereby causing electrons to be liberated from said tip substantially by field-emission.

* * * * *